US007759724B2

(12) United States Patent
Forbes

(10) Patent No.: US 7,759,724 B2
(45) Date of Patent: *Jul. 20, 2010

(54) MEMORY CELLS HAVING GATE STRUCTURE WITH MULTIPLE GATES AND MULTIPLE MATERIALS BETWEEN THE GATES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/207,141

(22) Filed: Sep. 9, 2008

(65) Prior Publication Data

US 2009/0008697 A1 Jan. 8, 2009

Related U.S. Application Data

(60) Continuation of application No. 11/062,543, filed on Feb. 22, 2005, now Pat. No. 7,443,715, which is a division of application No. 09/945,554, filed on Aug. 30, 2001, now Pat. No. 6,963,103.

(51) Int. Cl.
*G11C 14/00* (2006.01)

(52) U.S. Cl. .................. 257/315; 257/903; 365/185.08

(58) Field of Classification Search ................. 257/314, 257/315, 316, 317, 321, 324, 390, 410, 411, 257/903, 904; 365/149, 154, 185.01, 185.08
See application file for complete search history.

(56) References Cited

U.S. PATENT DOCUMENTS 4,295,150 A 10/1981 Adam
4,412,902 A 11/1983 Michikami et al.
4,510,584 A 4/1985 Dias et al.
4,545,035 A 10/1985 Guterman et al.
4,556,975 A 12/1985 Smith et al.
4,665,417 A 5/1987 Lam
4,672,240 A 6/1987 Smith et al.
4,688,078 A 8/1987 Hseih
4,757,360 A 7/1988 Faraone
4,780,424 A 10/1988 Holler (Continued)

OTHER PUBLICATIONS

Aarik, Jaan, et al., "Anomalous effect of temperature on atomic layer deposition of titanium dioxide", *Journal of Crystal Growth*, 220(4), (Dec. 2000), 531-537.

(Continued)

*Primary Examiner*—Thomas L Dickey
(74) *Attorney, Agent, or Firm*—Schwegman, Lundberg & Woessner, P.A.

(57) ABSTRACT

Structures and methods are provided for SRAM cells having a novel, non-volatile floating gate transistor, e.g. a non-volatile memory component, within the cell which can be programmed to provide the SRAM cell with a definitive asymmetry so that the cell always starts in a particular state. The SRAM cells include a pair of cross coupled transistors. At least one of the cross coupled transistors includes a first source/drain region and a second source/drain region separated by a channel region in a substrate. A floating gate opposes the channel region and separated therefrom by a gate oxide. A control gate opposes the floating gate. The control gate is separated from the floating gate by a low tunnel barrier intergate insulator.

13 Claims, 12 Drawing Sheets

U.S. PATENT DOCUMENTS 4,939,559 A 7/1990 DiMaria et al.
5,042,011 A 8/1991 Casper et al.
5,057,448 A 10/1991 Kuroda
5,071,782 A 12/1991 Mori
5,073,519 A 12/1991 Rodder
5,153,880 A 10/1992 Owen et al.
5,280,205 A 1/1994 Green et al.
5,315,142 A 5/1994 Acovic et al.
5,331,188 A 7/1994 Acovic et al.
5,338,953 A 8/1994 Wake
5,350,738 A 9/1994 Hase et al.
5,353,431 A 10/1994 Doyle et al.
5,399,516 A 3/1995 Bergendahl et al.
5,418,389 A 5/1995 Watanabe
5,429,966 A 7/1995 Wu et al.
5,474,947 A 12/1995 Chang et al.
5,488,612 A 1/1996 Heybruck
5,497,494 A 3/1996 Combs et al.
5,498,558 A 3/1996 Kapoor
5,508,544 A 4/1996 Shah
5,576,567 A 11/1996 Mori
5,600,592 A 2/1997 Atsumi et al.
5,608,670 A 3/1997 Akaogi et al.
5,618,575 A 4/1997 Peter
5,618,761 A 4/1997 Eguchi et al.
5,619,051 A 4/1997 Endo
5,619,642 A 4/1997 Nielsen et al.
5,627,785 A 5/1997 Gilliam et al.
5,677,867 A 10/1997 Hazani
5,691,230 A 11/1997 Forbes
5,703,387 A 12/1997 Hong
5,705,415 A 1/1998 Orlowski et al.
5,712,180 A 1/1998 Guterman et al.
5,733,661 A * 3/1998 Ue et al. .................... 428/426
5,739,567 A 4/1998 Wong
5,751,038 A 5/1998 Mukherjee
5,768,192 A 6/1998 Eitan
5,798,548 A 8/1998 Fujiwara
5,801,401 A 9/1998 Forbes
5,808,943 A 9/1998 Sato et al.
5,852,306 A 12/1998 Forbes
5,880,991 A 3/1999 Hsu et al.
5,910,916 A 6/1999 Akaogi et al.
5,923,056 A 7/1999 Lee et al.
5,936,274 A 8/1999 Forbes et al.
5,952,692 A 9/1999 Nakazato et al.
5,959,465 A 9/1999 Beat
5,969,383 A 10/1999 Chang et al.
5,973,355 A 10/1999 Shirai et al.
5,981,350 A 11/1999 Geusic et al.
5,986,932 A 11/1999 Ratnakumar et al.
5,991,225 A 11/1999 Forbes et al.
6,009,011 A 12/1999 Yamauchi
6,025,228 A 2/2000 Ibok et al.
6,025,627 A 2/2000 Forbes et al.
6,031,263 A 2/2000 Forbes et al.
6,069,380 A 5/2000 Chou et al.
6,069,816 A * 5/2000 Nishimura .................. 365/145
6,087,222 A 7/2000 Jung Lin et al.
6,087,695 A 7/2000 Chen
6,091,626 A 7/2000 Madan
6,093,606 A 7/2000 Lin et al.
6,108,240 A 8/2000 Lavi et al.
6,118,147 A 9/2000 Liu
6,118,159 A 9/2000 Willer et al.
6,124,608 A 9/2000 Liu et al.
6,124,729 A 9/2000 Noble et al.
6,130,453 A 10/2000 Mei et al.
6,134,175 A 10/2000 Forbes et al.
6,135,175 A 10/2000 Gaudreault et al.
6,141,238 A 10/2000 Forbes et al.
6,141,248 A * 10/2000 Forbes et al. ........... 365/185.08
6,143,636 A 11/2000 Forbes et al.
6,144,584 A 11/2000 Kunori et al.
6,147,378 A 11/2000 Liu et al.
6,157,061 A 12/2000 Kawata
6,163,049 A 12/2000 Bui
6,169,306 B1 1/2001 Gardner et al.
6,180,461 B1 1/2001 Ogura
6,180,980 B1 1/2001 Wang
6,191,459 B1 2/2001 Hofmann et al.
6,204,529 B1 3/2001 Lung et al.
6,208,164 B1 3/2001 Noble et al.
6,210,999 B1 * 4/2001 Gardner et al. .............. 438/183
6,229,175 B1 5/2001 Uchida
6,238,976 B1 5/2001 Noble et al.
6,246,606 B1 6/2001 Forbes et al.
6,249,020 B1 6/2001 Forbes et al.
6,249,460 B1 6/2001 Forbes et al.
6,307,775 B1 10/2001 Forbes et al.
6,316,298 B1 11/2001 Lee
6,317,364 B1 11/2001 Guterman et al.
6,323,844 B1 11/2001 Yeh et al.
6,335,554 B1 1/2002 Yoshikawa
6,341,084 B2 1/2002 Numata et al.
6,351,411 B2 2/2002 Forbes et al.
6,376,312 B1 4/2002 Yu
6,377,070 B1 4/2002 Forbes
6,396,745 B1 5/2002 Hong et al.
6,424,001 B1 7/2002 Forbes et al.
6,433,382 B1 8/2002 Orlowski et al.
6,433,383 B1 8/2002 Ramsbey et al.
6,440,801 B1 8/2002 Furukawa et al.
6,461,905 B1 10/2002 Wang et al.
6,461,931 B1 10/2002 Eldridge
6,465,836 B2 10/2002 Lin et al.
6,475,857 B1 11/2002 Kim et al.
6,476,434 B1 11/2002 Noble et al.
6,504,207 B1 1/2003 Chen et al.
6,514,842 B1 2/2003 Prall et al.
6,519,176 B1 2/2003 Hamzaoglu et al.
6,521,943 B1 2/2003 Mine et al.
6,541,280 B2 4/2003 Kaushik et al.
6,566,682 B2 5/2003 Forbes
6,574,143 B2 6/2003 Nakazato
6,580,124 B1 6/2003 Cleeves et al.
6,586,797 B2 7/2003 Forbes et al.
6,730,575 B2 5/2004 Eldridge
6,740,928 B2 5/2004 Yoshii et al.
6,753,568 B1 6/2004 Nakazato et al.
6,753,571 B2 6/2004 Kim et al.
6,754,108 B2 6/2004 Forbes
6,778,441 B2 8/2004 Forbes et al.
6,794,250 B2 9/2004 Chang et al.
6,800,895 B2 10/2004 Chang et al.
6,881,994 B2 4/2005 Lee et al.
6,894,944 B2 5/2005 Ishibashi et al.
6,903,367 B2 6/2005 Forbes
6,950,340 B2 9/2005 Bhattacharyya
6,952,032 B2 10/2005 Forbes et al.
6,958,937 B2 10/2005 Forbes et al.
6,963,103 B2 * 11/2005 Forbes ........................ 257/315
7,027,328 B2 4/2006 Forbes et al.
7,068,544 B2 6/2006 Forbes et al.
7,074,673 B2 7/2006 Forbes
7,075,829 B2 7/2006 Forbes
7,087,954 B2 8/2006 Forbes
7,112,841 B2 9/2006 Eldridge et al.
7,126,183 B2 10/2006 Forbes et al.
7,132,711 B2 11/2006 Forbes et al.
7,135,734 B2 11/2006 Eldridge et al.
7,136,302 B2 11/2006 Forbes et al.
7,153,744 B2 12/2006 Chen et al.
7,154,138 B2 12/2006 Hofmann et al.

| | | | |
|---|---|---|---|
| 7,163,863 | B2 | 1/2007 | Shone |
| 7,166,886 | B2 | 1/2007 | Forbes |
| 7,187,587 | B2 | 3/2007 | Forbes |
| 7,205,601 | B2 | 4/2007 | Lee et al. |
| 7,274,067 | B2 | 9/2007 | Forbes |
| 7,372,096 | B2 | 5/2008 | Forbes et al. |
| 7,372,097 | B2 | 5/2008 | Forbes et al. |
| 7,391,072 | B2 | 6/2008 | Forbes et al. |
| 7,443,715 | B2 * | 10/2008 | Forbes ........................ 365/154 |
| 7,446,368 | B2 | 11/2008 | Eldridge et al. |
| 7,465,983 | B2 | 12/2008 | Eldridge et al. |
| 7,473,956 | B2 | 1/2009 | Eldridge et al. |
| 7,476,925 | B2 | 1/2009 | Eldridge et al. |
| 7,504,687 | B2 | 3/2009 | Eldridge et al. |
| 7,508,025 | B2 | 3/2009 | Eldridge et al. |
| 7,545,674 | B2 | 6/2009 | Forbes et al. |
| 2001/0013621 | A1 | 8/2001 | Nakazato |
| 2001/0041250 | A1 | 11/2001 | Werkhoven et al. |
| 2002/0008324 | A1 | 1/2002 | Shinkawata |
| 2002/0024083 | A1 | 2/2002 | Noble et al. |
| 2002/0106536 | A1 | 8/2002 | Lee et al. |
| 2002/0109138 | A1 | 8/2002 | Forbes |
| 2002/0110973 | A1 | 8/2002 | Liou et al. |
| 2002/0110983 | A1 | 8/2002 | Liu et al. |
| 2002/0137250 | A1 | 9/2002 | Nguyen et al. |
| 2002/0140022 | A1 | 10/2002 | Lin et al. |
| 2002/0175326 | A1 | 11/2002 | Reed et al. |
| 2002/0176293 | A1 | 11/2002 | Forbes et al. |
| 2003/0042528 | A1 | 3/2003 | Forbes |
| 2003/0043637 | A1 | 3/2003 | Forbes et al. |
| 2003/0134475 | A1 | 7/2003 | Hofmann et al. |
| 2004/0032773 | A1 | 2/2004 | Forbes |
| 2004/0160830 | A1 | 8/2004 | Forbes |
| 2004/0207038 | A1 | 10/2004 | Hofmann et al. |
| 2005/0023595 | A1 | 2/2005 | Forbes et al. |
| 2005/0023602 | A1 | 2/2005 | Forbes et al. |
| 2005/0023603 | A1 | 2/2005 | Eldridge et al. |
| 2005/0024945 | A1 | 2/2005 | Forbes |
| 2005/0026349 | A1 | 2/2005 | Forbes et al. |
| 2005/0169054 | A1 | 8/2005 | Forbes |
| 2006/0001049 | A1 | 1/2006 | Forbes |
| 2006/0002192 | A1 | 1/2006 | Forbes et al. |
| 2006/0170029 | A1 | 8/2006 | Liu et al. |
| 2006/0199338 | A1 | 9/2006 | Eldridge et al. |
| 2006/0231886 | A1 | 10/2006 | Forbes et al. |
| 2006/0234450 | A1 | 10/2006 | Forbes et al. |
| 2006/0237768 | A1 | 10/2006 | Forbes et al. |
| 2006/0263981 | A1 | 11/2006 | Forbes |
| 2006/0274580 | A1 | 12/2006 | Forbes |
| 2006/0278917 | A1 | 12/2006 | Forbes et al. |
| 2007/0018214 | A1 | 1/2007 | Ahn |
| 2007/0105313 | A1 | 5/2007 | Forbes |
| 2007/0138534 | A1 | 6/2007 | Eldridge et al. |
| 2007/0145462 | A1 | 6/2007 | Eldridge et al. |
| 2007/0170492 | A1 | 7/2007 | Forbes et al. |
| 2007/0178635 | A1 | 8/2007 | Eldridge et al. |
| 2007/0195608 | A1 | 8/2007 | Forbes et al. |

OTHER PUBLICATIONS

Aarik, Jaan, "Texture development in nanocrystalline hafnium dioxide thin films grown by atomic layer deposition", *Journal of Crystal Growth*, 220(1-2), (Nov. 15, 2000), 105-113.

Afanas'Ev, V, et al., "Electron energy barriers between (100)Si and ultrathin stacks of SiO2, Al2O3, and $ZrO_3$ and $ZrO_2$ insulators", *Applied Physics Letters*, 78(20), (May 14, 2001), 3073-3075.

Arya, S. P.S., et al., "Conduction properties of thin $Al_2/O_3$ films", *Thin Solid Films*, 91(4), (May 28, 1982), 363-374.

Dipert, Brian, "Flash Memory Goes Mainstream", *IEEE Spectrum*, 30(10), (Oct. 1993), 48-52.

Eierdal, L., et al., "Interaction of oxygen with Ni(110) studied by scanning tunneling microscopy", *Surface Science*, 312(1-2), (Jun. 1994), 31-53.

Eitan, Boaz, et al., "NROM: A Novel Localized Trapping, 2-Bit Nonvolatile Memory Cell", *IEEE Electron Device Letters*, 21(11), (Nov. 2000), 543-545.

Eldridge, J. M, et al., "Analysis of ultrathin oxide growth on indium", *Thin Solid Films*, 12(2), (Oct. 1972), 447-451.

Eldridge, J. M., et al., "Growth of Thin PbO Layers on Lead Films. I. Experiment", *Surface Science*, 40(3), (Dec. 1973), 512-530.

Eldridge, J., et al., "Measurement of Tunnel Current Density in a Metal-Oxide-Metal System as a Function of Oxide Thickness", *Proc. 12th Intern. Conf. on Low Temperature Physics*, (1971), 427-428.

Ferguson, J D, et al., "Atomic layer deposition of $Al_2O_3$ and $SiO_2$ on BN particles using sequential surface reactions", *Applied Surface Science*, 162-163, (Aug. 1, 2000), 280-292.

Greiner, J., "Josephson Tunneling Barriers by rf Sputter Etching in an Oxygen Plasma", *Journal of Applied Physics*, 42(12), (Nov. 1971), 5151-5155.

Greiner, J., "Oxidation of lead films by rf sputter etching in an oxygen plasma", *Journal of Applied Physics*, 45(1), (Jan. 1974), 32-37.

Grimbolt, J., "I. Interaction of Al Films with $O_2$ at Low Pressures", *Journal of the Electrochemical Society*, 129(10), pp. 2366-2368.

Grimbolt, J., "II. Oxidation of Al Films", *Journal of Electrochem Soc.: Solid-State Science and Technology*, (1982), pp. 2369-2372.

Gundlach, K., et al., "Logarithmic conductivity of Al-$Al_2O_3$-Al tunneling junctions produced by plasma- and by thermal-oxidation", *Surface Science*, 27(1), (Aug. 1971), 125-141.

Guo, X., "High Quality Ultra-thin (1.5 nm) High quality ultra-thin (1.5 nm) $TiO_2$-$Si_3N_4$ gate dielectric for deep sub-micron CMOS technology", *International Electron Devices Meeting 1999. Technical Digest*, (1999), 137-140.

Hodges, D. A., et al., "Analysis and Design of Digital Integrated Circuits", *McGraw-Hill Book Company, 2nd Edition*, (1988), 394-396.

Hurych, Z., "Influence of Non-Uniform Thickness of Dielectric Layers on Capacitance and Tunnel Currents", *Solid-State Electronics*, 9, (1966), 967-979.

Itokawa, H, "Determination of Bandgap and Energy Band Alignment for High-Dielectric-Constant Gate Insulators Using High-Resolution X-ray Photoelectron Spectroscopy", *Extended Abstracts of the 1999 International Conference on Solid State Devices and Materials*, (1999), 158-159.

Kim, H., "Leakage current and electrical breakdown in metal-organic chemical vapor deposited TiO/sub 2/ dielectrics on silicon substrates", *Applied Physics Letters*, 69(25), (Dec. 16, 1996), 3860-3862.

Kim, Yeong K, et al., "Novel capacitor technology for high density stand-alone and embedded DRAMs", *International Electron Devices Meeting 2000. Technical Digest. IEDM*, (2000), 369-372.

Kim, Yong S, et al., "Effect of rapid thermal annealing on the structure and the electrical properties of atomic-layer-deposited $Ta_2O_5$ films", *Journal of the Korean Physical Society*, (Dec. 2000), 975-979.

Kubaschewski, O., et al., "Oxidation of Metals and Alloys", *Butterworths, London*, (1962), 53-63.

Kubaschewski, O., et al., "Oxidation of Metals and Alloys,", *Butterworths, London*, Second Edition, (1962), 1-3, 5,6, 8-12, 24, 36-39.

Kukli, Kaupo, "Atomic Layer Deposition of Titanium Oxide from $TiI_4$ and $H_2O_2$", *Chemical Vapor Deposition*, 6(6), (2000), 303-310.

Kukli, Kaupo, et al., "Atomic layer deposition of zirconium oxide from zirconium tetraiodide, water and hydrogen peroxide", *Journal of Crystal Growth*, 231(1-2), (Sep. 2001), 262-272.

Kukli, Kaupo, et al., "Real-time monitoring in atomic layer deposition of $TiO_2$ from $TiI_4$ and $H_2O$-$H_2O_2$", *Langmuir*, 16(21), (Oct. 17, 2000), 8122-8128.

Kukli, Kukli, et al., "Development of Dielectric Properties of Niobium Oxide, Tantalum Oxide, and Aluminum Oxide Based Nanolayered Materials", *Journal of the Electrochemical Society*, 148(2), (Feb. 2001), F35-F41.

Kwo, J., "Properties of high k gate dielectrics $Gd_2O_3$ and $Y_2O_3$ for Si", *Journal of Applied Physics*, 89(7), (2001), 3920-3927.

Lee, J., et al., "Effect of polysilicon gate on the flatband voltage shift and mobility degradation for ALD-$Al_2O_3$ gate dielectric", *International Electron Devices Meeting 2000. Technical Digest. IEDM*, (2000), 645-648.

Luan, H. F., et al., "High Quality $Ta_2O_5$ Gate Dielectrics with Tox,eq less than 10A", *IEDM Technical Digest. International Electron Devices Meeting*, (Dec. 5-8, 1999), 141-143.
Ma, Yanjun, et al., "Zirconium oxide based gate dielectrics with equivalent oxide thickness of less than 1.0 nm and performance of submicron MOSFET using a nitride gate replacement process", *International Electron Devices Meeting 1999. Technical Digest*, (1999), 149-152.
Marshalek, R., et al., "Photoresponse Characteristics of Thin-Film Nickel-Nickel Oxide-Nickel Tunneling Junctions", *IEEE Journal of Quantum Electronics, QE-19(4)* , (1983), 743-754.
Masuoka, F., et al., "A 256K Flash EEPROM using Triple Polysilicon Technology", *IEEE International Solid-State Circuits Conference, Digest of Technical Papers*, (1985), 168-169.
Masuoka, F., et al., "A New Flash EEPROM Cell using Triple Polysilicon Technology", *International Electron Devices Meeting, Technical Digest*, San Francisco, CA, (1984), 464-467.
Mori, S., et al., "Reliable CVD Inter-Poly Dielectrics for Advanced E&EEPROM", *Symposium on VSLI Technology, Digest of Technical Papers*, (1985), 16-17.
Muller, H., "Electrical and Optical Properties of Sputtered $In_2O_3$ Films", *Physica Status Solidi*, 27(2), (1968), 723-731.
Paranjpe, Ajit, et al., "Atomic layer deposition of AlOx for thin film head gap applications", *Journal of the Electrochemical Society*, 148(9), (Sep. 2001), 465-471.
Pashley, R., et al., "Flash Memories: the best of two worlds", *IEEE Spectrum*, 26(12), (Dec. 1989), 30-33.
Pollack, S., et al., "Tunneling Through Gaseous Oxidized Films of $Al_2O_3$", *Transactions of the Metallurgical Society of AIME*, 233, (1965), 497-501.
Qi, Wen-Jie, et al., "MOSCAP and MOSFET characteristics using $ZrO_2$ gate dielectric deposited directly on Si", *International Electron Devices Meeting 1999. Technical Digest*, (1999), 145-148.
Robertson, J., "Band offsets of wide-band-gap oxides and implications for future electronic devices", *Journal of Vacuum Science & Technology B (Microelectronics and Nanometer Structures)*, 18(3), (May-Jun. 2000), 1785-1791.
Robertson, J., et al., "Schottky Barrier height of Tantalum oxide, barium strontium titanate, lead titanate, and strontium bismuth tantalate", *Applied Physics Letters*, 74(8), (Feb. 22, 1999), 1168-1170.
Shi, Ying, et al., "Tunneling Leakage Current in Ultrathin (<4 nm) Nitride/Oxide Stack Dielectrics", *IEEE Electron Device Letters*, 19(10), (Oct. 1998), 388-390.
Simmons, J., "Generalized Formula for the Electric Tunnel Effect between Similar Electrodes Separated by a Thin Insulating Film", *Journal of Applied Physics*, 34(6), (1963), 1793-1803.
Smith, Ryan C, "Chemical vapour deposition of the oxides of titanium, zirconium and hafnium for use as high-k materials in microelectronic devices. A carbon-free precursor for the synthesis of hafnium dioxide", *Advanced Materials for Optics and Electronics*, 10(3-5), (May-Oct. 2000), 105-106.
Swalin, R., "Equilibrium between Phases of Variable Composition", *In: Thermodynamics of solids*, New York, J. Wiley, 2nd Edition, (1972), 165-180.
Sze, S., "Physics of Semiconductor Devices, Second Edition", *John Wiley & Sons, New York*, (1981), 553-556.
Yan, J., "Structural and electrical characterization of $TiO_2$ grown from titanium tetrakis-isopropoxide (TTIP) and TTIP/H2O ambients", *Journal of Vacuum Science Technology B 14(3)*, (1996), 1706-1711.
Zhang, H., "Atomic layer deposition of high dielectric constant nanolaminates", *Journal of The Electrochemical Society*, 148(4), (Apr. 2001), F63-F66.

* cited by examiner

MEMORY CELLS HAVING GATE STRUCTURE WITH MULTIPLE GATES AND MULTIPLE MATERIALS BETWEEN THE GATES

CROSS REFERENCE TO RELATED APPLICATIONS

The present application is a Continuation of U.S. application Ser. No. 11/062,543, filed Feb. 22, 2005 now U.S. Pat. No. 7,443,715, which is a divisional of U.S. application Ser. No. 09/945,554, filed Aug. 30, 2001, now U.S. Pat. No. 6,963, 103, all of which are incorporated herein by reference in their entirety.

This application is related to the following co-pending, commonly assigned U.S. patent applications: "DRAM Cells with Repressed Memory Metal Oxide Tunnel Insulators," U.S. Pat. No. 6,754,108; "Programmable Array Logic or Memory Devices with Asymmetrical Tunnel Barriers," Ser. No. 09/943,134; "Dynamic Electrically Alterable Programmable Memory with Insulating Metal Oxide Interpoly Insulators," U.S. Pat. No. 6,778,441; and "Field Programmable Logic Arrays with Metal Oxide and/or Low Tunnel Barrier Interpoly Insulators," Ser. No. 09/945,512; "Flash Memory with Low Tunnel Barrier Interpoly Insulators," Ser. No. 09/945,507; and "Programmable Memory Address and Decode Devices with Low Tunnel Barrier Interpoly Insulators," Ser. No. 09/945,500; which were filed on Aug. 30, 2001, and each of which disclosure is herein incorporated by reference.

FIELD OF THE INVENTION

The present invention relates generally to integrated circuits, and in particular to SRAM cells with repressed floating gate memory, metal oxide tunnel interpoly insulators.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

As stated, SRAM devices are one form of RAM device. SRAM devices differ from DRAM devices in that they do not require constant refreshing. A standard SRAM cell 100 is shown in FIG. 1A. Cell 100 consists of four transistors 106, 108, 110, 112, and two control transistors 102 and 104. Data is stored with either a high potential at node A and a low potential at node B, or a low potential at node A and a high potential at node B. This means that two stable states are available which are defined as a logic "1" or a logic "0".

In FIG. 1A, the logic state of SRAM cell 100, i.e., either a "1" or "0", is read by sensing the cell current on bit line pair comprised of bit lines 116 and 117 and/or the differential voltage developed thereon. When word line 118 is selected, cell 100 is activated by turning on control transistors 102 and 104. If the activated SRAM cell 100 is in logic state "1" node A is high and node B is low. Transistor 108 will be off, transistor 112 will be on, transistor 106 will be on, and transistor 110 will be off. Since transistors 112 and 104 are on, bit line 117 will carry cell current, while bit line 116 will not carry any cell current since transistor 108 is off.

The logic state "0" would be the opposite with node A low and node B high. Transistor 108 will be on, transistor 112 will be off, transistor 106 will be off, and transistor 110 will be on. Bit line 116 will carry cell current, while bit line 117 will not carry cell current.

FIG. 1B illustrates an alternative SRAM cell 150 as contained in the prior art. In this cell 150, transistors 206 and 210 are replaced by two resistors 252, 254. The operation of the cell 150, however, is essentially the same as the operation of the cell 100 (FIG. 1A). The SRAM cell 150 can also be used in and accessed from the memory and SRAM devices illustrated and described below in FIGS. 2 and 3.

Thus, FIGS. 1A and 1B illustrate conventional SRAM devices. If the SRAM cell is perfectly symmetrical then upon start-up or power supply voltage, Vdd, being applied the two output nodes, V1 and V2, both go to the same potential 1.25V. In reality of course the cell can never be perfectly symmetrical and random variations in parameters will cause it to start in some random configuration with either a "one" or "zero" stored in the cell.

These conventional SRAM cells can be fabricated with a built in asymmetry by making some devices with a threshold voltage, VT, larger than normal, and some devices normal by controlling the doping content of the devices. This can also be conventionally done by making some of the devices, e.g. transistors, larger than others. These approaches, however, add cost and complexity to the fabrication process.

Other alternative approaches for providing such built in asymmetry are described in U.S. Pat. No. 6,141,248, entitled "DRAM AND SRAM MEMORY CELLS WITH REPRESSED MEMORY," by L. Forbes, and A. R. Reinberg, issued Oct. 31, 2000; and U.S. Pat. No. 6,141,238, entitled "DYNAMIC RANDOM ACCESS MEMORY (DRAM) CELLS WITH REPRESSED FERROELECTRIC MEMORY METHODS OF READING SAME, AND APPARATUSES INCLUDING SAME," by L. Forbes, K. Y. Ahn, W. P. Noble and A. R. Reinberg, issued Oct. 31, 2000.

When the SRAM cells are programmed in this manner upon start-up and/or when power supply voltage is first applied to the cell it will always start in one preferred state with either a logic state "0" or a logic state "1" stored in the cell. The use of the SRAM cells programmed in this manner, where it can also be used as a PROM, would be useful in either embedded or stand alone SRAM. The cells can operate either as RAM or ROM, and could also be used as field or inservice programmable read only memories or electrically alterable programmable read only memories (EAPROM or EEPROM).

These products provide system level integration solutions for high volume applications that incorporate logic, memory and megacells system building blocks. Gate arrays and embedded arrays can combine over a million gates of logic, with SRAM, ROM, EEPROM and flash memories into a single chip. Memory blocks of volatile and non-volatile memory technology lets you integrate, on-chip: ROM, Flash, EEPROM and SRAM. Memory Compilers enable you to generate, to your exact specifications: SRAM (single-port, dual-port or FIFO) memory functions.

As before, a drawback to the above approaches is that they add cost and complexity to the fabrication process. Also, in conjunction with using floating gate transistors within the memory cells, there are additional problems to resolve. The following description for programming floating gate transistors explains some of these problems.

In order to enable a reasonable write speed the floating gate transistor uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Approaches to resolve the above described problems include; the use of different floating gate materials, e.g. SiC, SiOC, GaN, and GaAlN, which exhibit a lower work function, the use of structured surfaces which increase the localized electric fields, and amorphous SiC gate insulators with larger electron affinity, Ω, to increase the tunneling probability and reduce erase time.

However, all of these approaches relate to increasing tunneling between the floating gate and the substrate such as is employed in a conventional ETOX device and do not involve tunneling between the control gate and floating gate through and inter-poly dielectric.

The original EEPROM or EARPROM and flash memory devices described by Toshiba in 1984 used the interpoly dielectric insulator for erase. (See generally, F. Masuoka et al., "A new flash EEPROM cell using triple polysilicon technology," IEEE Int. Electron Devices Meeting, San Francisco, pp. 464-67, 1984; F. Masuoka et al., "256K flash EEPROM using triple polysilicon technology," IEEE Solid-State Circuits Conf., Philadelphia, pp. 168-169, 1985). Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16-17, 1985). However, the rough top surface of the polysilicon floating gate resulted in, poor quality interpoly oxides, sharp points, localized high electric fields, premature breakdown and reliability problems.

Therefore, there is a need in the art to provide improved SRAM cells for memory devices with a definitive asymmetry so that the cell always starts in a particular state. In this manner, the cell can be used both stand alone SRAM and for embedded SRAM in combination with a microcontroller. Any such SRAM cells which employ a floating gate transistor which can be programmed to provide the SRAM cell with a definitive asymmetry should avoid the added cost, size and complexity described above and should avoid the large barriers to electron tunneling or hot electron injection presented by the silicon oxide-silicon interface, 3.2 eV, which result in slow write and erase speeds even at very high electric fields. Likewise, the floating gate transistors need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach for the non-volatile component, the above mentioned problems of having a rough top surface on the polysilicon floating gate which results in, poor quality interpoly oxides, sharp points, localized high electric fields, premature breakdown and reliability problems must be avoided.

DOCUMENTS

S. R. Pollack and C. E. Morris, "Tunneling through gaseous oxidized films of $Al_2O_3$," Trans. AIME, Vol. 233, p. 497, 1965.

T. P. Ma et al., "Tunneling leakage current in ultrathin (<a4 nm) nitride/oxide stack dielectrics," IEEE Electron Device Letters, vol. 19, no. 10, pp. 388-390, 1998.

O. Kubaschewski and B. E. Hopkins, "Oxidation of Metals and Alloys", Butterworth, London, pp. 53-64, 1962.

J. M. Eldridge and J. Matisoo, "Measurement of tunnel current density in a Meal-Oxide-Metal system as a function of oxide thickness," Proc. 12th Intern. Conf. on Low Temperature Physics, pp. 427-428, 1971.

J. M. Eldridge and D. W. Dong, "Growth of thin PbO layers on lead films. I. Experiment," Surface Science, Vol. 40, pp. 512-530, 1973.

J. H. Greiner, "Oxidation of lead films by rf sputter etching in an oxygen plasma", J. Appl. Phys., Vol. 45, No. 1, pp. 32-37, 1974.

J. M. Eldridge and J. Matisoo, entitled "Measurement of tunnel current density in a Meal-Oxide-Metal system as a function of oxide thickness," Proc. 12th Intern. Conf. on Low Temperature Physics, pp. 427-428, 1971.

S. M. Sze, Physics of Semiconductor Devices, Wiley, NY, pp. 553-556, 1981.

G. Simmons and A. El-Badry, "Generalized formula for the electric tunnel effect between similar electrodes separated by a thin insulating film," J. Appl. Phys., Vol. 34, p. 1793, 1963.

S. R. Pollack and C. E. Morris, "Tunneling through gaseous oxidized films of $Al_2O_3$," Trans. AIME, Vol. 233, p. 497, 1965, Z. Hurych, "Influence of nonuniform thickness of dielectric layers on capacitance and tunnel currents," Solid-State Electronics, Vol. 9, p. 967, 1966.

S. P. S. Arya and H. P. Singh, "Conduction properties of thin $Al_2O_3$ films," Thin Solid Films, Vol. 91, No. 4, pp. 363-374, May 1982.

K.-H. Gundlach and J. Holzl, "Logarithmic conductivity of Al—$Al_2O_3$—Al tunneling junctions produced by plasma- and by thermal-oxidation", surface Science, Vol. 27, pp. 125-141, 1971.

J. Grimblot and J. M. Eldridge, "I. Interaction of Al films with $O_2$ at low pressures", J. Electro. Chem. Soc., Vol. 129, No. 10. pp. 2366-2368, 1982.

J. Grimblot and J. M. Eldridge, "II. Oxidation of Al films", ibid, 2369-2372, 1982.

J. M. Greiner, "Josephson tunneling barriers by rf sputter etching in an oxygen plasma," J. Appl. Phys., Vol. 42, No. 12, pp. 5151-5155, 1971.

O. Michikami et al., "Method of fabrication of Josephson tunnel junctions," U.S. Pat. No. 4,412,902, Nov. 1, 1983.

H. F. Luan et al., "High quality $Ta_2O_5$ gate dielectrics with $T_{ox,eq}$<10 angstroms," IEDM Tech. Digest, pp. 141-144, 1999.

Hase et al., "Method of manufacturing an oxide superconducting film," U.S. Pat. No. 5,350,738, Sep. 27, 1994.

SUMMARY OF THE INVENTION

The above mentioned problems with conventional SRAM cells for memory devices and other problems are addressed by the present invention and will be understood by reading and studying the following specification. SRAM cells and memory devices are provided where at least one of the transistors in the cross coupled cell includes a novel floating gate transistor, e.g. a non-volatile memory component, which can be programmed to provide the SRAM cell with a definitive asymmetry so that the cell always starts in a particular state. In this manner, the cell can be used both as stand alone SRAM and for embedded SRAM in combination with a microcontroller. According to the teachings of the present invention, the non-volatile component includes a floating gate separated from a control gate by a metal oxide and/or low tunnel barrier interpoly insulator.

In one embodiment of the present invention, an SRAM cell includes a pair of cross coupled transistors. At least one of the cross coupled transistors includes a first source/drain region and a second source/drain region separated by a channel region in a substrate. A floating gate opposes the channel region and separated therefrom by a gate oxide. A control gate opposes the floating gate. The control gate is separated from the floating gate by a low tunnel barrier intergate insulator. And, the floating gate can be programmed by tunneling charge between the floating gate and the control gate to provide the SRAM cell with a definitive asymmetry so that the cell always starts in a particular state.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1A:
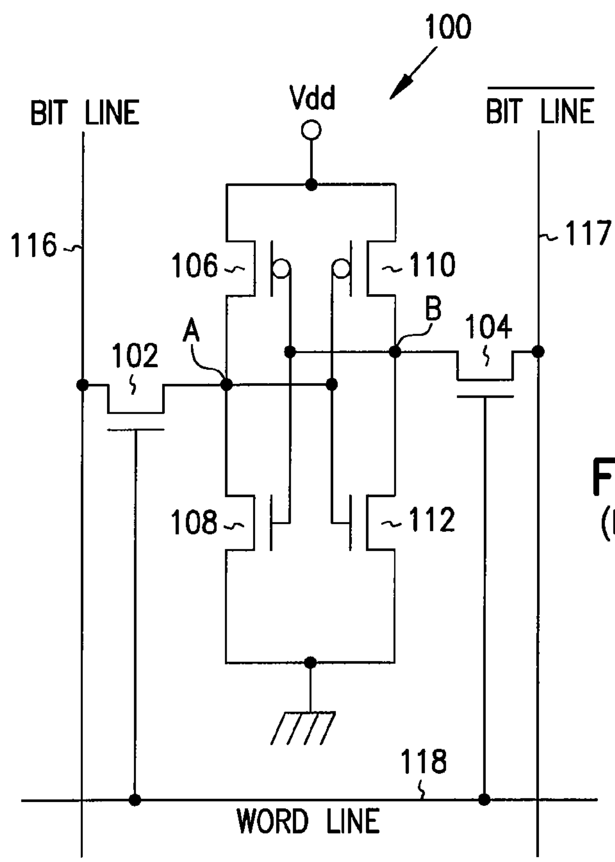
FIGS. 1A and 1B are circuit diagrams illustrating SRAM cells constructed in accordance with the prior art.
Figure 1B:
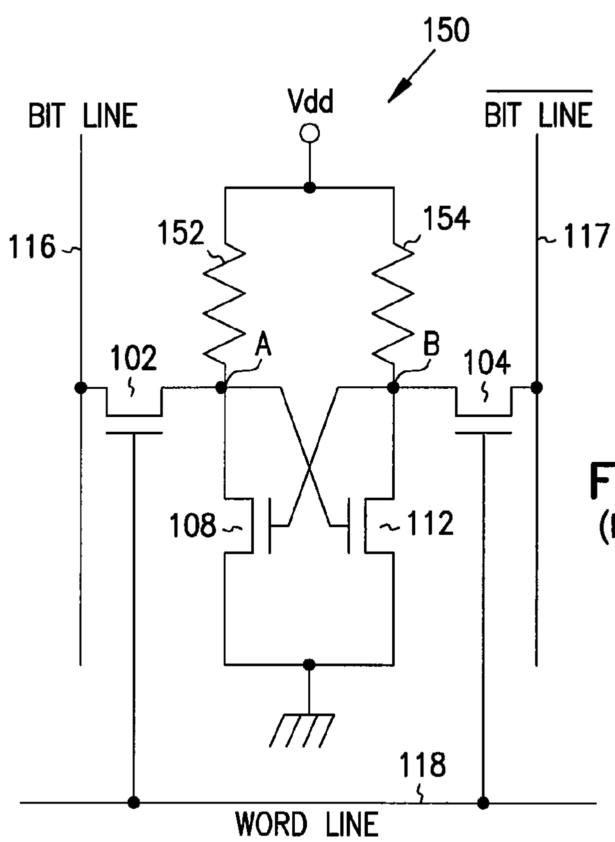
Figure 2:
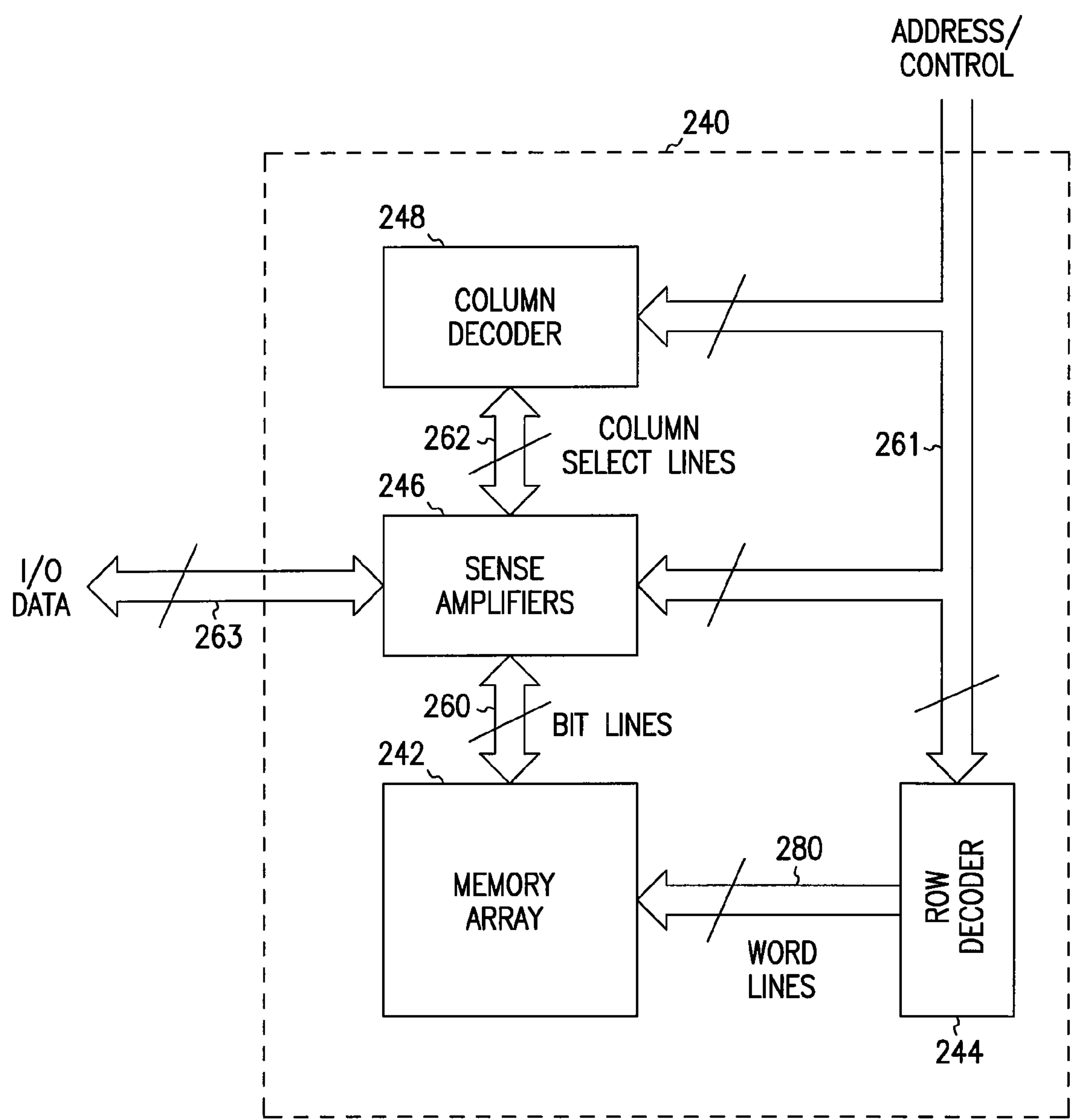
FIG. 2 is a block diagram illustrating a memory device such as can include SRAM cells.

FIG. 2 is a block diagram illustrating a memory device 240 such as can include SRAM cells. The memory device 240 contains a memory array 242, row and column decoders 244, 248 and a sense amplifier circuit 246. The memory array 242 can include a plurality of memory cells such as the SRAM cells 100 and 150 shown in FIG. 1. As shown in FIG. 2, the memory device includes word lines 280 and bit lines 260 which are commonly arranged into rows and columns, respectively. The bit lines 260 of the memory array 242 are connected to the sense amplifier circuit 246, while its word lines 280 are connected to the row decoder 244. Address and control signals are input on address/control lines 261 into the memory device 240 and connected to the column decoder 248, sense amplifier circuit 246 and row decoder 244 and are used to gain read and write access, among other things, to the memory array 242.

The column decoder 248 is connected to the sense amplifier circuit 246 via control and column select signals on column select lines 262. The sense amplifier circuit 246 receives input data destined for the memory array 242 and outputs data read from the memory array 242 over input/output (I/O) data lines 263. Data is read from the cells of the memory array 242 by activating a word line 280 (via the row decoder 244), which couples all of the memory cells corresponding to that word line to respective bit lines 260, which define the columns of the array. One or more bit lines 260 are also activated. When a particular word line 280 and bit lines 260 are activated, the sense amplifier circuit 246 connected to a bit line column detects and amplifies the data bit transferred from the memory cell to its bit line 260 by measuring the potential difference between the activated bit line 260 and a reference line which may be an inactive bit line. The operation of such sense amplifiers will be known and understood by one of ordinary skill in the art upon reading this disclosure.

Figure 3:
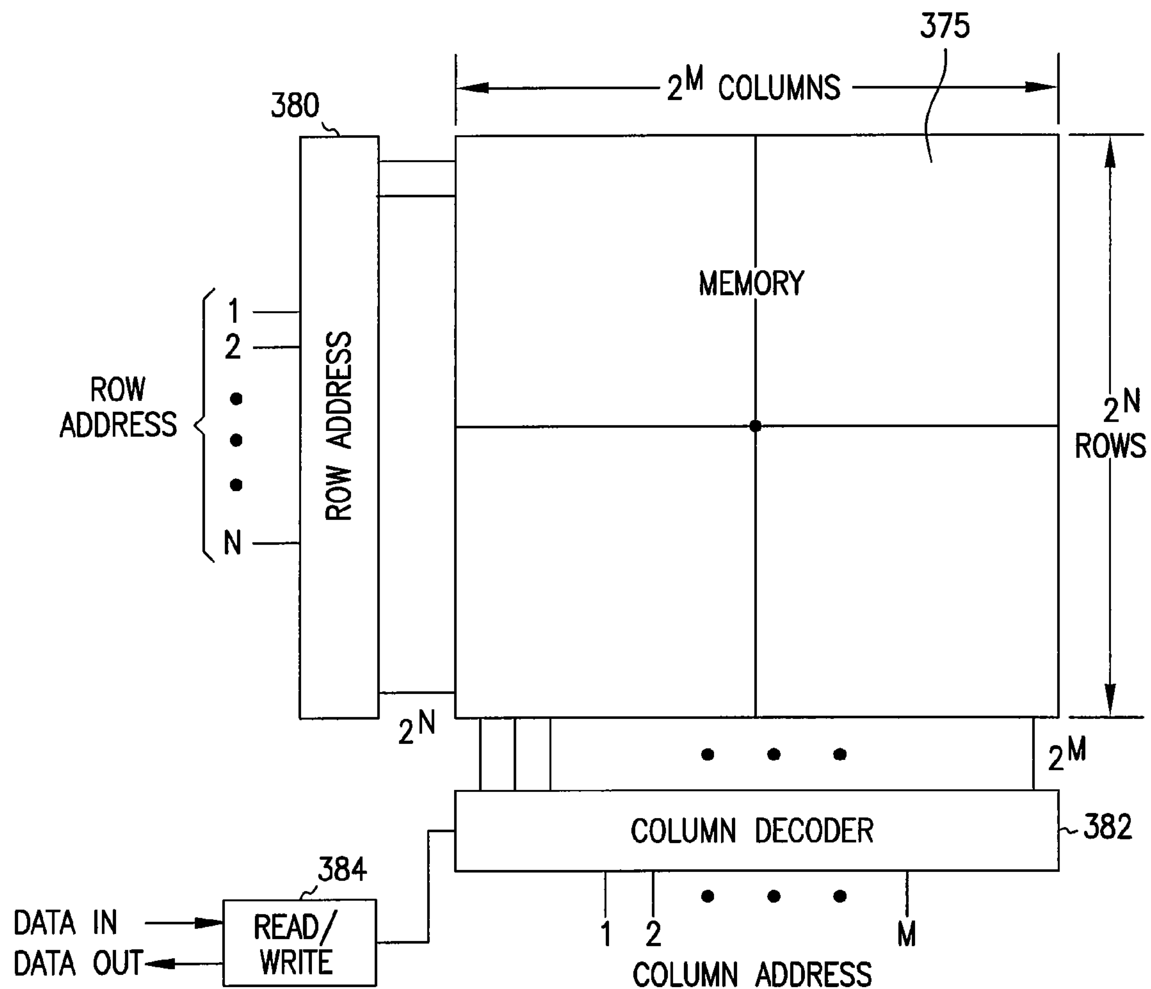
FIG. 3 is a block diagram of another embodiment of a memory device such as can include SRAM cells.

FIG. 3 is a block diagram of another embodiment of a memory device such as can include SRAM cells. As stated above, memory cells 100 and 150 of either embodiment shown in FIGS. 1A and 1B can be embedded in an array of similar cells as shown in FIG. 3. A typical memory array consists of a matrix of storage bits with bit capacity $2^N \times 2^M$ bits arranged in an array 375 with $2^M$ columns (bit lines) and $2^N$ rows (word lines).

To read data stored in the array 375, a row address is input and decoded by row decoder 380 to select one of the rows or word lines. All of the cells along this word line are activated. Column decoder 382 then addresses one bit out of the $2^M$ bits that have been activated and routes the data that is stored in that bit to a sense amplifier (not shown) and then out of the array 375. Data in and Data out are controlled by the Read/Write Control circuit 384.

The present invention, describes the use of a cross coupled SRAM cell where at least one of the transistors in the cross coupled cell includes a novel floating gate transistor, e.g. non-volatile memory component as described below, which can be programmed to provide the SRAM cell with a definitive asymmetry so that the cell always starts in a particular state. In this manner, the cell can be used both stand alone SRAM and for embedded SRAM in combination with a microcontroller. The typical application would, in fact, want to be user field or in service programmable with different nonvolatile data patterns stored for each user. One usage for the present invention is to replace a boot ROM, but other applications could be to store data that can be updated or over written later. In other words the cell can be programmed to always start with either a "zero" or "one" stored in the cell and the information used for start-up instructions. This built in asymmetry has no effect upon normal operation of the cell as an SRAM. In these cases large asymmetries are written into the cell by programming it by holding either node voltage, V1; or V2, at ground or a low voltage.

Figure 4:
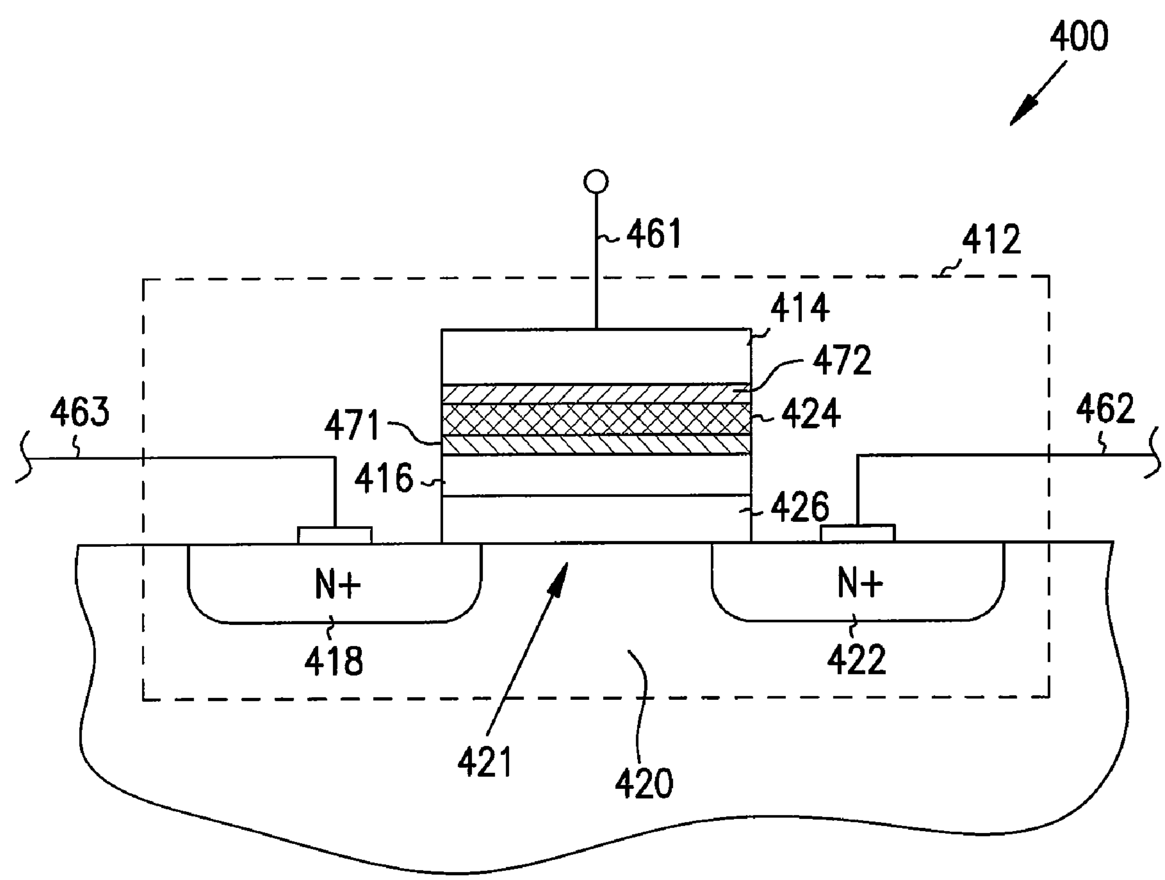
FIG. 4 illustrates a novel memory cell constructed in accordance with the present invention and suited for use in SRAM cells of the invention.

According to the teachings of the present invention, the non-volatile memory component includes a low tunnel barrier intergate, or interpoly, insulator between the control gate and the floating gate. An example is shown in FIG. 4. According to the teachings of the present invention. According to the teachings of the present invention, the low tunnel barrier intergate insulator can include aluminum oxide, transition metal oxides, and perovskite oxide tunnel barriers, and others of the like, between the floating gate and control gate. An example for these metal oxide intergate insulators has been described in detail in the copending, co-filed application entitled, "Flash Memory with Low Tunnel Barrier Interpoly Insulators," Ser. No. 09/945,507. The use of metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 4 illustrates a novel memory cell device 400 constructed in accordance with the present invention and suited for use in SRAM cells of the invention as described in connection with FIGS. 5A-5C below. As shown in FIG. 4, the memory cell 400 includes a first source/drain region 418 and a second source/drain region 422 separated by a channel region 421 in a substrate 420. A floating gate 416 opposes the channel region 421 and is separated therefrom by a gate oxide 426. A control gate 414 opposes the floating gate 416. According to the teachings of the present invention, the control gate 414 is separated from the floating gate 416 by a low tunnel barrier intergate insulator 424.

In one embodiment of the present invention, low tunnel barrier intergate insulator 424 includes a metal oxide insulator selected from the group consisting of lead oxide (PbO) and aluminum oxide ($Al_2O_3$). In an alternative embodiment of the present invention, the low tunnel barrier intergate insulator 424 includes a transition metal oxide and the transition metal oxide is selected from the group consisting of $Ta_2O_5$, $TiO_2$, $ZrO_2$, and $Nb_2O_5$. In still another alternative embodiment of the present invention, the low tunnel barrier intergate insulator 424 includes a Perovskite oxide tunnel barrier.

According to the teachings of the present invention, the floating gate 416 includes a polysilicon floating gate 416 having a metal layer 471 formed thereon in contact with the low tunnel barrier intergate insulator 424. Likewise, the control gate 414 includes a polysilicon control gate 414 having a metal layer 472 formed thereon in contact with the low tunnel barrier intergate insulator 424. In one embodiment of the invention, the metal layers, 471 and 472, are formed of the same metal material used to form the metal oxide interpoly insulator 424.

As shown in FIG. 4, a control gate line 461 is coupled to the control gate 414. Electrical connections are also made to the first and the second source/drain regions, 418 and 422, via lines 462 and 463 respectively. In one embodiment line 462 can couple the first source/drain region 418 to either a ground potential or a power supply potential Vdd. Likewise, in one embodiment line 462 can couple the second source/drain region 422 to a bitline node. As one of ordinary skill in the art will understand upon reading this disclosure, the above described orientation is provided by illustration only and can be reversed. The invention is not so limited.

Figure 5A:
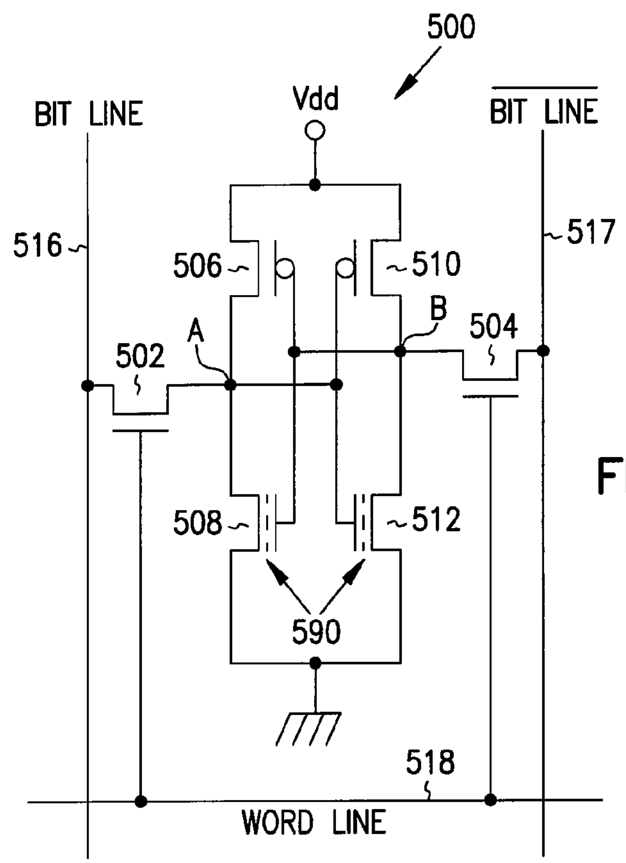
FIGS. 5A, 5B and 5C are circuit diagrams illustrating SRAM cells constructed in accordance with the present invention using the novel memory cell of FIG. 4.
Figure 5B:
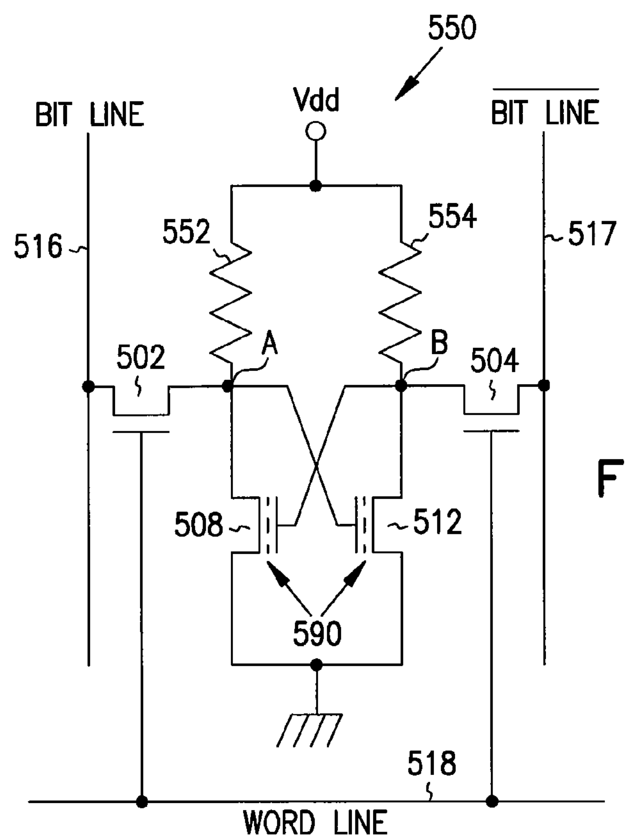
Figure 5C:
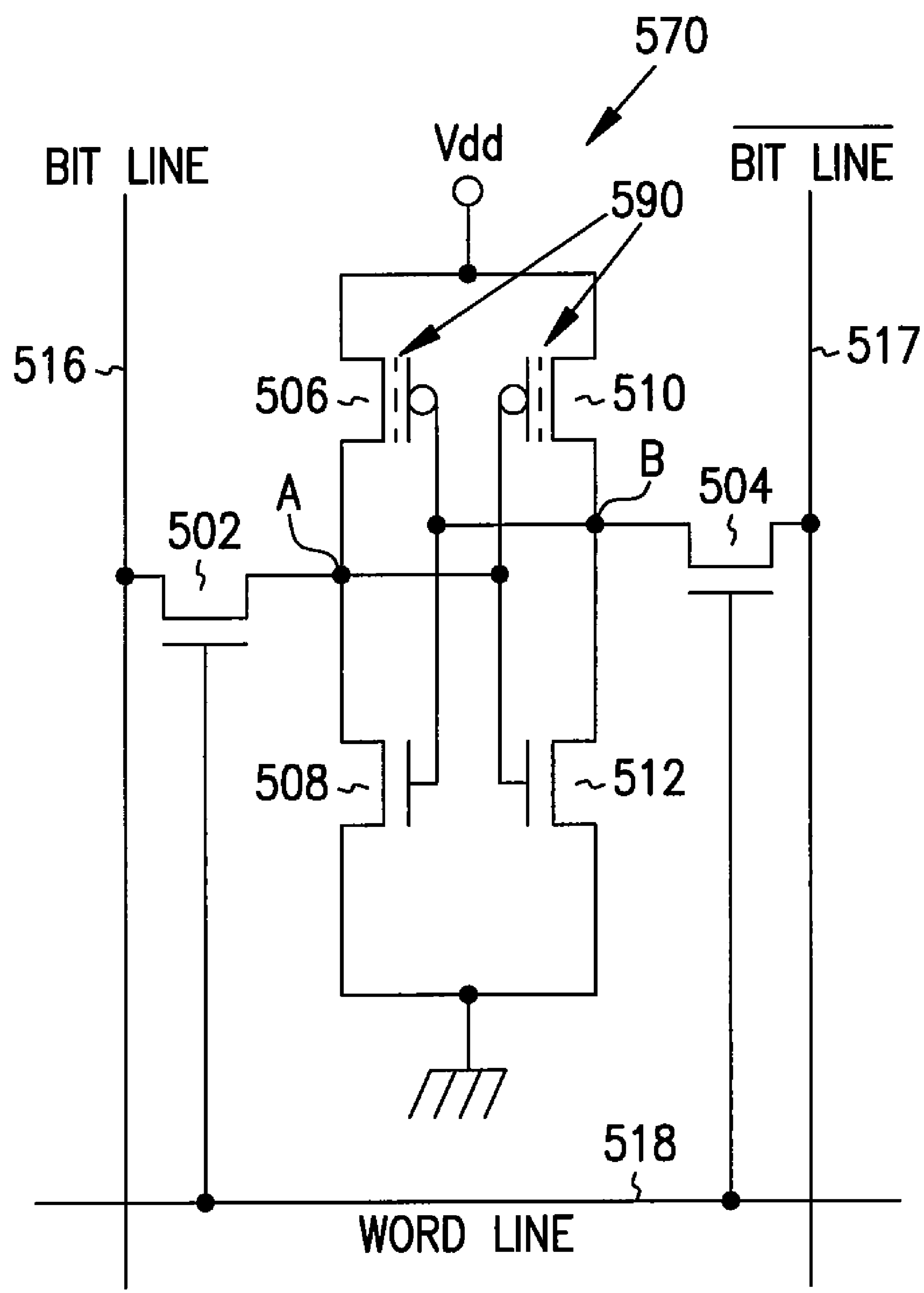

FIGS. 5A, 5B and 5C are circuit diagrams illustrating SRAM cells constructed in accordance with the present invention using the novel memory cell of FIG. 4. That is, FIGS. 5A, 5B and 5C illustrate the implementation of the novel memory cell of FIG. 5 into a number of different embodiments for SRAM cells, e.g. 500, 550, and 570, according to the teachings of the present invention. The cells 500, and 550 are similar to the cells 100 and 150 illustrated in FIGS. 1A and 1B with the exception that different transistors 508, 512 replace the transistors 108 and 112 from FIGS. 1A and 1B. According to the teachings of the present invention, the transistors 508, 512 are transistors having a control gate and a floating gate as explained and described in detail in connection with FIG. 4. As will be described below, the use of the transistors 508, 512 allows the cells 500, 550 of the present invention to be operated as either a conventional SRAM cell or as a nonvolatile memory cell (i.e., a SRAM with repressed memory).

FIG. 5C illustrates a novel alternate embodiment for an SRAM cell using the novel memory cell of FIG. 4 according to the teachings of the present invention. In FIG. 5C, the novel memory cell of FIG. 5 is formed as a PMOS transistor rather than as the NMOS transistors employed in the SRAM cells of FIGS. 5A and 5B. That is, in FIG. 5C the SRAM cell 570 includes a pair of cross coupled PMOS transistors 506 and 510 formed according to the teachings of the present invention within the cross coupled SRAM cell 570.

The operation of the SRAM cells of FIGS. 5A and 5B is explained as follows. When the cells 500, 550 are to be accessed as SRAM cells, information may be written to and read from the cells 500, 550 as described above with reference to FIGS. 1A and 1B. That is, data is stored with either a high potential at node A and a low potential at node B, or a low potential at node A and a high potential at node B. Similarly, the logic state of the SRAM cells 500, 550 is read by sensing the cell current on a bit line pair comprised of bit lines 516 and 517 and/or the differential voltage developed thereon. If the cells 500, 550 are in logic state "1," node A is high and node B is low. If the cells 500, 550 are in logic state "0," the reverse is true with node A low and node B high.

For the cells 500, 550 to be used as nonvolatile memory in a programmed state, e.g. PROM, EAPROM, or EEPROM, one of the transistors 508, 512 has to be programmed to the first charge state, while the other transistor has to be programmed to the second charge state. For example, to place the cells 500, 550 into logic state "1," e.g., node A high, node B low, transistor 508 must be programmed into the first charge state and transistor 512 into the second charge state. This raises the resistance of transistor 508, making it less conductive and causing node A to be high, while node B goes low. Similarly, to place the cells 500, 550 into logic state "0," e.g., node A low, node B high, transistor 512 must be programmed into the first charge state and transistor 508 into the second charge state. This raises the resistance of transistor 512, making it less conductive and causing node B to be high, while node A goes low.

The floating gates 590 of transistors 508 and 512 are programmed with the tunnel-tunnel mode technique. In one embodiment, the floating gates 590 of transistors 508 and 512 can be programmed using conventional hot electron channel injection. That is, a tunnel mode is used to transfer electrons from the source to the floating gates of the transistors 508, 512 to program the gates 590 and the transistors 508, 512 to the first charge state (i.e., tunnel write operation). This first charge state is referred to herein as the tunnel write operation.

Referring to FIG. 4, write can be achieved by the normal channel hot electron injection and gate current through the gate silicon oxide 426 to the floating gate 416. This is done by selecting a particular column by applying a high control gate voltage and applying relatively large drain voltage as is done with conventional ETOX flash memory devices. However, according to the teachings of the present invention, write can also be accomplished by applying a positive voltage to the substrate 420 or well select line and a large negative voltage to the control gates 414, electrons will tunnel from the control gate 414 to the floating gate 416. The low tunnel barrier 424 will provide an easy write operation and the selection of the substrate 420 or well bias will provide selectivity and address only one device. It should be noted that a negative charge on the floating gate 416, referred to herein as the "first charge state," can be associated with either a logic "0" or "1" and that the invention is not limited to any particular association between the first charge state and a particular logic value. The one requirement is that the program, erase and sensing circuitry used to access the nonvolatile portion of the cells 500 and 550 associate the first charge state to the same logic value.

According to the teachings of the present invention, a tunnel mode is used to transfer the electrons from the floating gate 416 to the control gate 414 to program the transfer device 412, e.g. the floating gate 416 and thus the nonvolatile portion of the cells 500 and 550, to a second charge state. The second charge state is referred to herein as the tunnel erase operation. According to the teachings of the present invention, the tunnel erase operation is achieved by driving the floating gate 416, through the control gate 414 and word line 461, with a large positive voltage. That is, according to the teachings of the present invention, erase is achieved by providing a negative voltage to the substrate 420 or well address line and a large positive voltage to the control gate 414. This causes electrons to tunnel off of the floating gate 416 on to the control gate 414. A whole row can be erased by addressing all the column lines along that row and a block can be erased by addressing multiple row back gate or substrate/well 420 address lines.

The operation of the SRAM cell of FIG. 5C is explained as follows. When cell 570 is to be accessed as an SRAM cell, information may be written to and read from cell 570 is the reverse manner from that described above in connection with FIGS. 3A and 3B. Data is again stored with either a high potential at node A and a low potential at node B, or a low potential at node A and a high potential at node B. Similarly, the logic state of SRAM cell 570 is read by sensing the cell current on a bit line pair comprised of bit lines 516 and 517 and/or the differential voltage developed thereon. If the cell 570 is in logic state "1," node A is high and node B is low. If the cell 570 is in logic state "0," the reverse is true with node A low and node B high.

For the cell 570 to be used as nonvolatile memory, e.g. PROM, EAPROM, or EEPROM, one of the transistors 506, 510 has to be programmed to the first charge state, while the other transistor has to be programmed to the second charge state. For example, to place the cell 570 into logic state "1," e.g., node A high, node B low, transistor 506 must be programmed into the first charge state and transistor 510 into the second state. This lowers the resistance of transistor 506, making it more conductive and causing node A to be high, while node B goes low. Similarly, to place the cell 570 into logic state "0," e.g., node A low, node B high, transistor 510 must be programmed into the first charge state and transistor 506 into the second charge state. This lowers the resistance of transistor 510, making it more conductive and causing node B to be high, while node A goes low.

According to the teachings of the present invention, and referring to FIG. 4, write can be accomplished by applying a positive voltage to the substrate 420 or well select line and a large negative voltage to the control gates 414, electrons will tunnel from the control gate 414 to the floating gate 416. The low tunnel barrier 424 will provide an easy write operation and the selection of the substrate or well 420 bias will provide selectivity and address only one device. It should be noted that a negative charge on the floating gate 416, referred to herein as the "first charge state," can be associated with either a logic "0" or "1" and that the invention is not limited to any particular association between the first charge state and a particular logic value. The one requirement is that the program, erase and sensing circuitry used to access the nonvolatile portion of the cell 570 associate the first charge state to the same logic value.

According to the teachings of the present invention, a tunnel mode is used to transfer the electrons from the floating gate 416 to the control gate 414 to program the transfer device 412, e.g. the floating gate 416 and thus the nonvolatile portion of the cell 570, to a second charge state. The second charge state is referred to herein as the tunnel erase operation. According to the teachings of the present invention, the tunnel erase operation is achieved by driving the floating gate 416, through the control gate 414 and word line 461, with a large positive voltage. That is, according to the teachings of the present invention, erase is achieved by providing a negative voltage to the substrate or well 420 address line and a large positive voltage to the control gate 414. This causes electrons to tunnel off of the floating gate 416 on to the control gate 414. A whole row can be erased by addressing all the column lines along that row and a block can be erased by addressing multiple row back gate or substrate/well 420 address lines.

As shown in FIGS. 5A-5C, read is accomplished as in conventional SRAM cell memory devices. A column line is addressed by applying a wordline 518 voltage and sensing the current along the data bit or drain row address line, e.g. 516 and 517.

It should be noted that the lack of a negative charge on the floating gate, shown as 590 in FIGS. 5A-5C, referred to herein as the "second charge state," can be associated with either a logic "0" or "1" and that the invention is not limited to any particular association between the second charge state and a particular logic value. The one requirement is that the program, erase and sensing circuitry used to access the nonvolatile portion of the cell, e.g. 500, 550, and 570, associate the second charge state to the same logic value and that the logic value be different than the value chosen for the first charge state.

When the SRAM cells 500, 550 and 570 are programmed in this manner upon start-up and/or when power supply voltage is first applied to the cells they will always start in one preferred state with either a logic state "0" or a logic state "1" stored in the cell. The use of the SRAM cells 500, 550 and 570 in this manner is particularly useful for start-up conditions and the saving and/or restoring of the state of a central processing unit (CPU) that is executing software instructions in a protected mode of operation. Moreover, these SRAM cells 500, 550 and 570 can be used instead of the typical ROM devices used for start-up.

According to the teachings of the present invention, SRAM cells 500, 550, and 570, as shown in FIGS. 5A, 5B and 5C can be embedded in an array of similar cells as shown in FIGS. 2 and 3. As described in connection with FIG. 3, a typical memory array consists of a matrix of storage bits with bit capacity $2^N \times 2^M$ bits arranged in an array 375 with $2^M$ columns (bit lines) and $2^N$ rows (word lines).

To read data stored in the array 375, a row address is input and decoded by row decoder 380 to select one of the rows or word lines. All of the cells along this word line are activated. Column decoder 382 then addresses one bit out of the $2^M$ bits that have been activated and routes the data that is stored in that bit to a sense amplifier (not shown) and then out of the array 375. Data in and Data out are controlled by the Read/Write Control circuit 384.

As discussed above in connection with FIG. 4 and FIGS. 5A, 5B and 5C, the novel memory cell of the present invention can be operated as a SRAM and a nonvolatile memory and is suitable for use in the SRAM cells 500, 550 and 570 in many applications and systems that require both SRAM and nonvolatile memory. Examples include a fault tolerant system, start-up conditions, the saving and/or restoring of the state of a central processing unit (CPU) that is executing software instructions in a protected mode of operation, and shadow memory applications. Further, the SRAM cells 500, 550 and 570 can be used in an array such as the array 242 within the SRAM device 240 illustrated in FIG. 2 or it can be used as a separate special purpose memory if so desired. Moreover, a memory device such as the device 240 illustrated in FIG. 2 can contain an array 242 having conventional SRAM cells and SRAM cells with repressed memory constructed in accordance with the present invention.

Figure 6A:
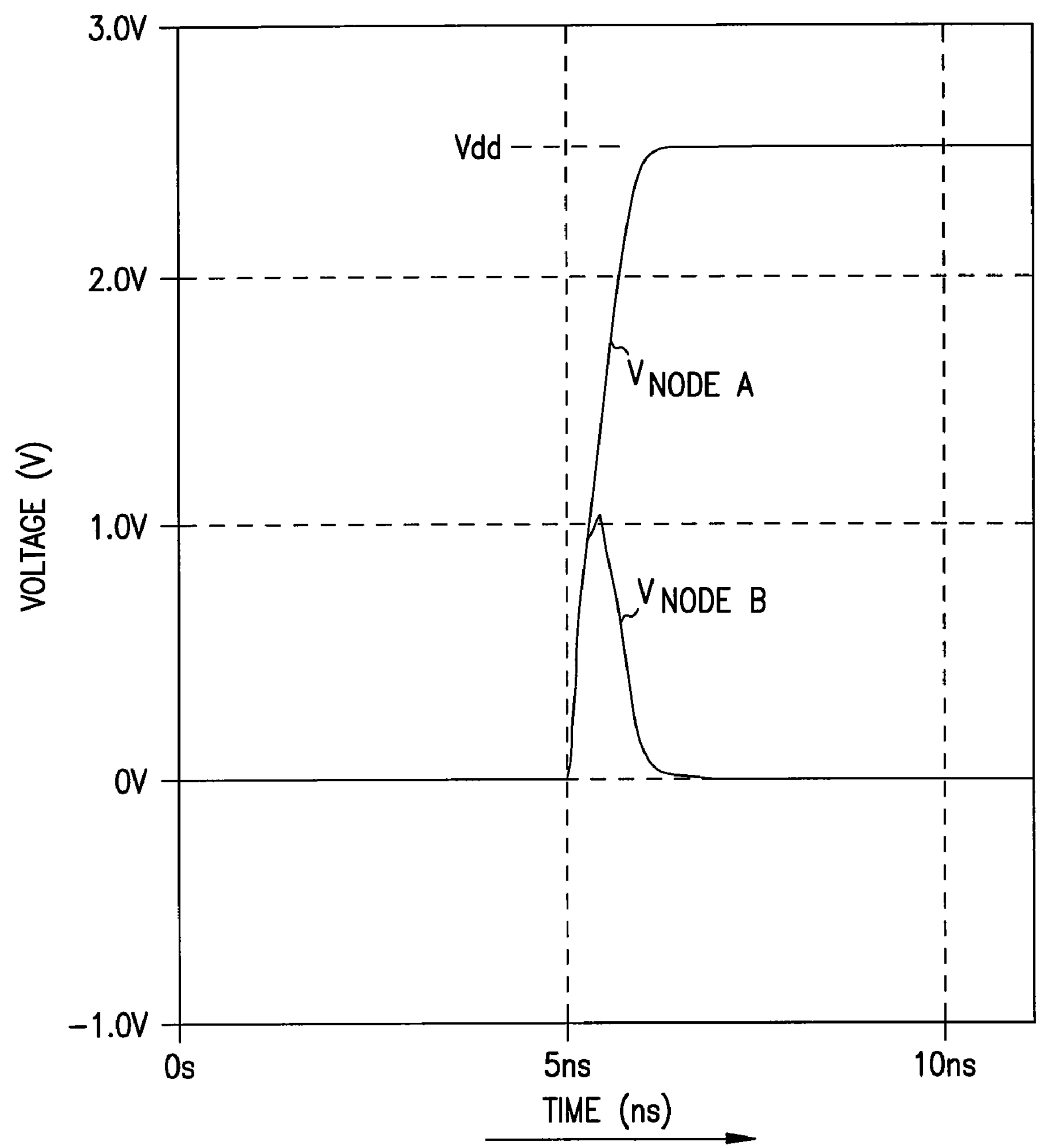
FIG. 6A illustrates is a graph of voltage versus time illustrating the output of an SRAM cell according to one embodiment of the present invention.
Figure 6B:
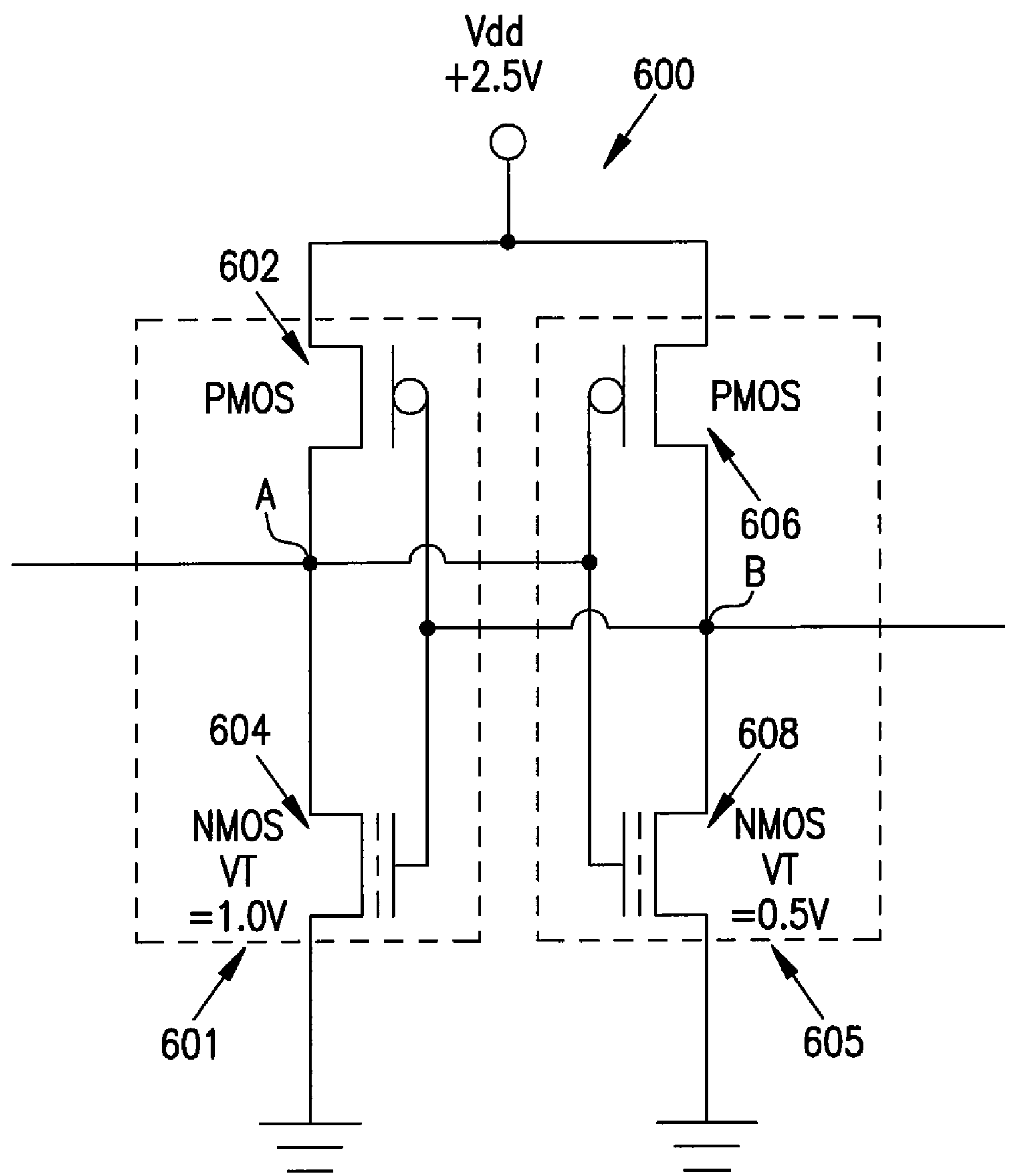
FIG. 6B is a circuit diagram of an embodiment of an SRAM cell, such as the SRAM cell shown in FIG. 5A, having novel NMOS transistors in the cross coupled cell constructed in accordance with FIG. 4, where a difference in threshold voltage has been programmed into the novel NMOS transistors.

FIG. 6A illustrates is a graph of voltage versus time illustrating the output of the SRAM cell of FIG. 6B, having novel NMOS transistors in the cross coupled cell constructed in accordance with FIG. 4, where a difference in threshold voltage has been programmed into the novel NMOS transistors.

FIG. 6B is analagous to the SRAM embodiment shown in FIG. 5A. As shown in FIG. 6B, the SRAM cell 600 includes a pair of cross coupled inverters. First inverter 601 includes a PMOS transistor 602 and an NMOS floating gate transistor 604 formed according to the teachings of the present invention. Second inverter 605 includes a PMOS transistor 606 and an NMOS floating gate transistor 608 formed according to the teachings of the present invention. That is, the NMOS transistors, 604 and 608, include NMOS transistors having a floating gate separated from a control gate by a low tunnel barrier intergate insulator. Thus, according to the teachings of the present invention, the NMOS transistors can be programmed by tunneling charge between the floating gate and the control gate as described in detail above. In this embodiment, floating gate NMOS transistor 604 has been programmed according to the teachings of the present invention with a charge present on its floating gate, e.g. is programmed in a first state. Floating gate NMOS transistor 608 has not been programmed with a charge on its floating gate, e.g. is programmed in a second state. Accordingly, floating gate NMOS transistor 604 is more resistive, and less conductive. Likewise, floating gate NMOS transistor 608 is more conductive driving node A high and driving node B low. This is also indicated in FIG. 6B where it is shown that floating gate NMOS transistor 604 has a threshold voltage, Vt, of 1.0 Volts and that floating gate NMOS transistor 608 has a threshold voltage, Vt, of 0.5 Volts. It should be noted that these voltage threshold representations are provided by way of example and not by way of limitation for illustrating the manner in which NMOS transistors 604 and 608 can be programmed, according to the teachings of the present invention, to have a defined asymmetry for the SRAM cell 600.

As shown in the graph of FIG. 6A, transistor 608 turns on more quickly since it possesses the lower threshold voltage, Vt. This causes the node voltage B to be lower than normal and the cell to switch and start up in a state with node voltage, B, low. In other words the cell can be programmed to always start with either a "zero" or "one" stored in the cell and the information used for start-up instructions.

This built in asymmetry has no effect upon normal operation of the cell as an SRAM. In these cases large asymmetries are written into the cell by programming it holding either node voltage, A or B, at ground or a low voltage. Thus, according to the teachings of the present invention, SRAM cell 600 can be used for both stand alone SRAM and for embedded SRAM in combination with a microcontroller. The typical application would, in fact, want to be user field or in service programmable with different nonvolatile data patterns stored for each user.

As one of ordinary skill in the art will understand upon reading this disclosure, the SRAM cells of the present invention include novel, floating gate programmable transistors which can be used in the NMOS active transistors 508 and 512 of a 6 transistor SRAM cell 500 as shown in FIG. 5A or as PMOS pull up devices 506 and 510 in of a 6 transistor SRAM cell 570, as shown in FIG. 5C. According to the teachings of the present invention, in the embodiment of FIG.

5C, the charge programmed onto a floating gate of the pull up devices 506 and 510 can be a lot "weaker" and still function appropriately.

One of ordinary skill in the art will understand upon reading this disclosure that 6 transistor cells offer the advantage of lower power dissipation, but consume more chip surface area. Hence, in another embodiment of the present invention, a 4-transistor cell 550 is included which offers higher density. In this embodiment, the NMOS transistors 508 and 512 are made programmable according to the teachings of the present invention.

Figure 7A:
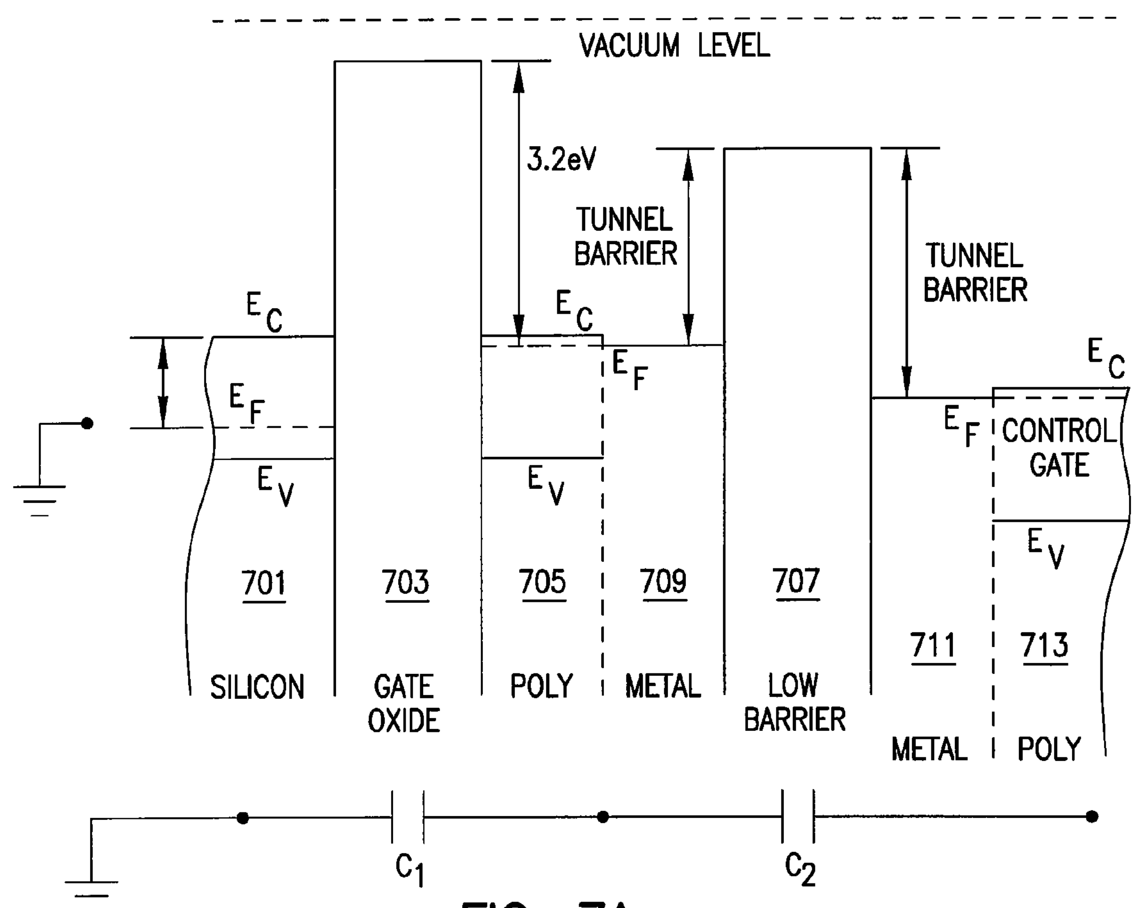
FIG. 7A is an energy band diagram illustrating the band structure at vacuum level with the low tunnel barrier interpoly insulator according to the teachings of the present invention.

FIG. 7A shows the band structure of the silicon substrate, e.g. channel region 701, silicon dioxide gate insulator, e.g. gate oxide 703, polysilicon floating gate 705, the low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

Figure 7B:
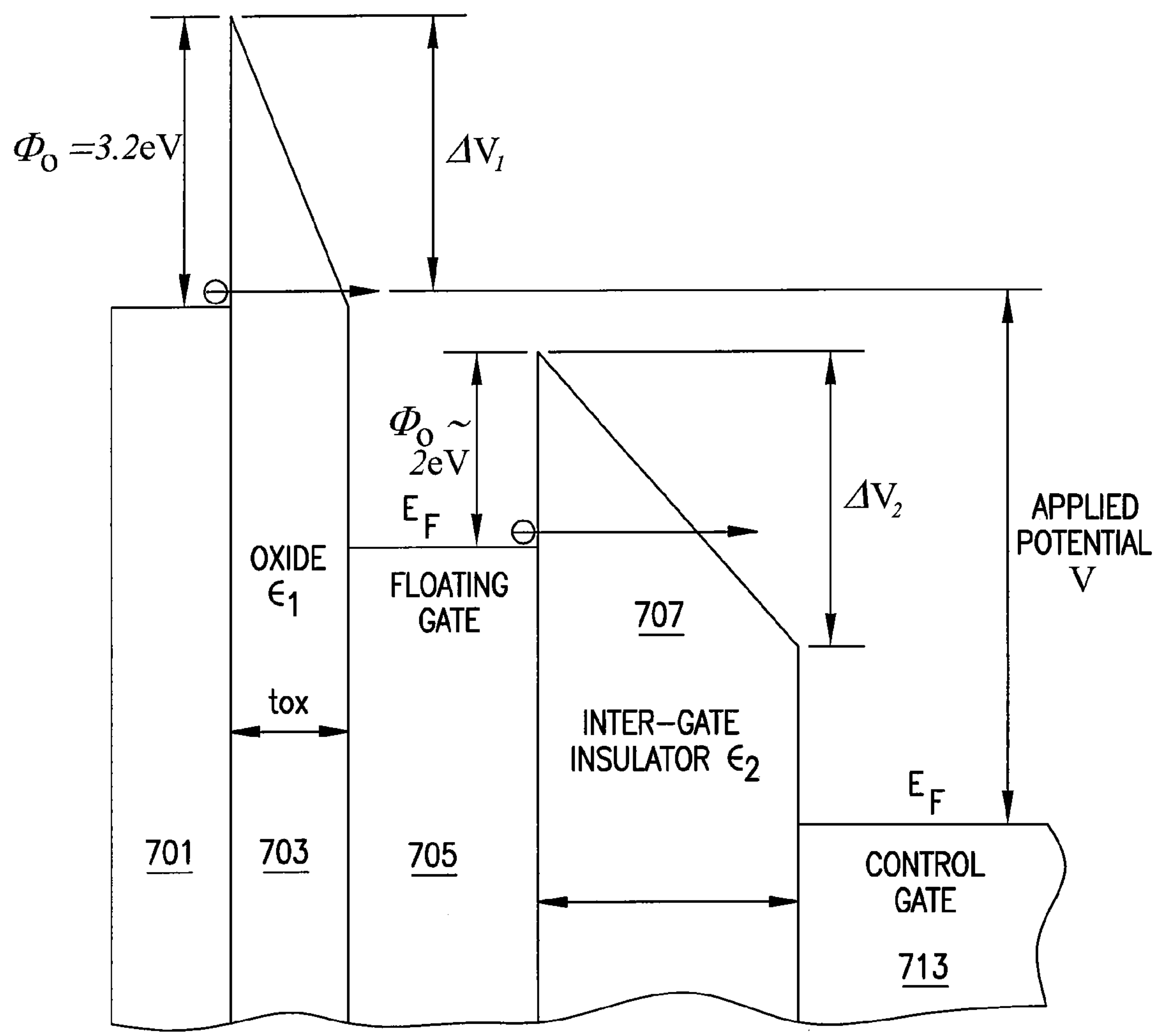
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure in the non-volatile memory component according to the teachings of the present invention.

As shown in FIG. 7B, the electric field is determined by the total voltage difference across the structure, the ratio of the capacitances (see FIG. 7A), and the thickness of the interpoly dielectric 707.

$$t_{ig} = \frac{\epsilon_2 \, tox}{\epsilon_1}$$

The voltage across the interpoly dielectric 707 will be, $\Delta V2 = V\,C1/(C1+C2)$, where $\Delta V$ is the total applied voltage. The capacitances, C, of the structures depends on the dielectric constant, $\epsilon_r$, the permittivity of free space, $\epsilon_0$, and the thickness of the insulating layers, t, and area, A, such that $C=\epsilon_r\epsilon_o A/t$, Farads/cm$^2$. The electric field across the interpoly dielectric insulator 707, having capacitance, C2, will then be $E2=\Delta V2/t2$, where t2 is the thickness of this layer.

The tunneling current in erasing charge from the floating gate 705 by tunneling to the control gate 713 will then be as shown in FIG. 7B given by an equation of the form:

$$J = B\exp(-Eo/E)$$

$$J = \frac{q^2E^2}{4\pi\hbar\Phi}e^{-E_O/E}$$

$$E_O = \frac{8\pi}{3}\frac{\sqrt{2m^*q}\,\Phi^{3/2}}{h}$$

where E is the electric field across the interpoly dielectric insulator 707 and Eo depends on the barrier height. Practical values of current densities for aluminum oxide which has a current density of 1 A/cm$^2$ at a field of about E=1V/20 A=5×10$^{+6}$ V/cm are evidenced in a description by Pollack. Practical current densities for silicon oxide transistor gate insulators which has a current density of 1 A/cm$^2$ at a field of about E=2.3V/23 A=1×10$^{+7}$ V/cm are evidenced in a description by T. P. Ma et al.

The lower electric field in the aluminum oxide interpoly insulator 707 for the same current density reflects the lower tunneling barrier of less than 2 eV, shown in FIG. 7B, as opposed to the 3.2 eV tunneling barrier of silicon oxide 703, also illustrated in FIG. 7B.

Figure 7C:
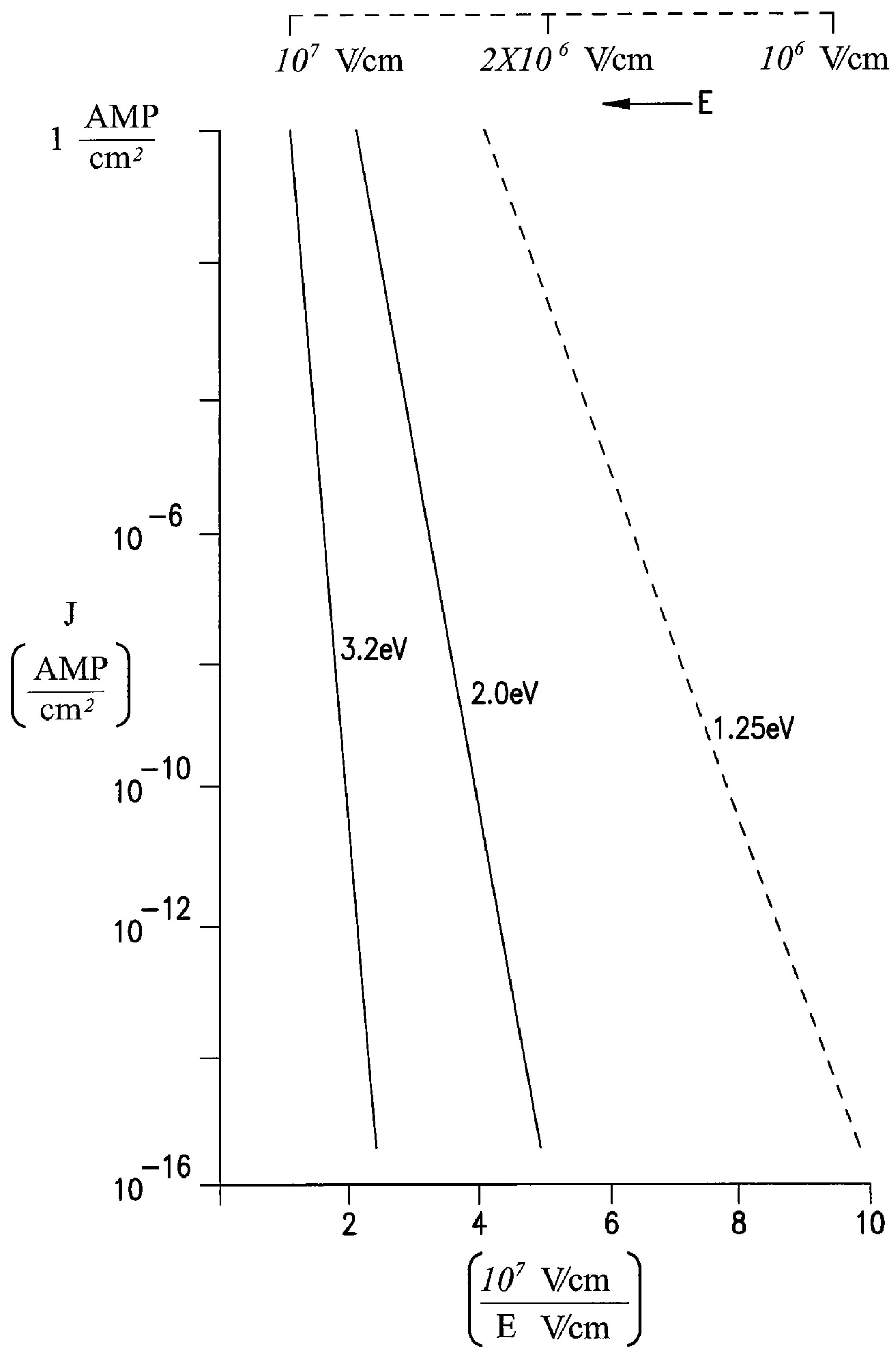
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for a number of barrier heights. FIG. 7C illustrates the dependence of the tunneling currents in the non-volatile memory component on electric field (reciprocal applied electric field) and barrier height. The fraction of voltage across the interpoly or intergate insulator, ΔV2, can be increased by making the area of the intergate capacitor, C2, (e.g. intergate insulator 707) smaller than the area of the transistor gate capacitor, C1 (e.g. gate oxide 703).

Methods of Formation

Several examples are outlined below in order to illustrate how a diversity of such metal oxide tunnel barriers can be formed for the non-volatile memory component, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native $SiO_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native $SiO_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

(iv) Modifications in the structure shown in FIG. 5 may be introduced in order to compensate for certain properties in some metal/oxide/metal layers. Such changes are reasonable since a wide range of metals, alloys and oxides with quite different physical and chemical properties can be used to form these tunnel junctions.

Example I

Formation of PbO Tunnel Barriers

This oxide barrier has been studied in detail using Pb/PbO/Pb structures. The oxide itself can be grown very controllably on deposited lead films using either thermal oxidation or rf sputter etching in an oxygen plasma. It will be seen that there are a number of possible variations on this structure. Starting with a clean poly-Si substrate, one processing sequence using thermal oxidation involves:

(i) Depositing a clean lead film on the poly-Si floating gate at ~25 to 75 C in a clean vacuum system having a base pressure of $10^{-8}$ Torr or lower. The Pb film will be very thin with a thickness within 1 or 2 A of its target value.

(ii) Lead and other metal films can be deposited by various means including physical sputtering and/or from a Knudsen evaporation cell. The sputtering process also offers the ability to produce smoother films by increasing the re-sputtering-to-deposition ratio since re-sputtering preferentially reduces geometric high points of the film.

(iii) Using a "low temperature oxidation process" to grow an oxide film of self-limited thickness. In this case, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 A, as determined via in situ ellipsometric or ex situ measurements of Josephson tunneling currents. This control is demonstrated by the very limited statistical scatter of the current PbO thickness data shown in the insert of FIG. 3. This remarkable degree of control over tunnel current is due to the excellent control over PbO thickness that can be achieved by "low temperature oxidation." For example, increasing the oxidation time from 100 to 1,000 minutes at an oxygen pressure of 750 Torr at 25 C only raises the PbO thickness by 3 A (e.g., from ~21 to 24 A). Accordingly, controlling the oxidation time to within 1 out of a nominal 100 minute total oxidation time provides a thickness that is within 0.1 A of 21 A. The PbO has a highly stoichiometric composition throughout its thickness, as evidenced from ellipsometry and the fact that the tunnel barrier heights are identical for Pb/PbO/Pb structures.

(iv) Re-evacuate the system and deposit the top lead electrode. This produces a tunnel structure having virtually identical tunnel barriers at both Pb/O interfaces.

(v) The temperature used to subsequently deposit the Poly-Si control gate must be held below the melting temperature (327 C) of lead. The PbO itself is stable (up to ~500 C or higher) and thus introduces no temperature constraint on subsequent processes. One may optionally oxidize the lead film to completion, thereby circumventing the low melting temperature of metallic lead. In this case, one would form a Poly-Si/PbO/Poly-Si tunnel structure having an altered tunnel barrier for charge injection. Yet another variation out of several would involve: oxidizing the lead film to completion; replacing the top lead electrode with a higher melting metal such as Al; and, then adding the poly-Si control layer. This junction would have asymmetrical tunneling behavior due to the difference in barrier heights between the Pb/PbO and PbO/Al electrodes.

Example II

Formation of $Al_2O_3$ Tunnel Barriers

A number of studies have dealt with electron tunneling in $Al/Al_2O_3/Al$ structures where the oxide was grown by "low temperature oxidation" in either molecular or plasma oxygen. Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.

(ii) Tunnel currents are asymmetrical in this system with somewhat larger currents flowing when electrons are injected from $Al/Al_2O_3$ interface developed during oxide growth. This asymmetry is due to a minor change in composition of the growing oxide: there is a small concentration of excess metal in the $Al_2O_3$, the concentration of which diminishes as the oxide is grown thicker. The excess $Al^{+3}$ ions produce a space charge that lowers the tunnel barrier at the inner interface. The oxide composition at the outer $Al_2O_3/Al$ contact is much more stoichiometric and thus has a higher tunnel barrier. In situ ellipsometer measurements on the thermal oxidation of Al films deposited and oxidized in situ support this model. In spite of this minor complication, $Al/Al_2O_3/Al$ tunnel barriers can be formed that will produce predictable and highly controllable tunnel currents that can be ejected from either electrode. The magnitude of the currents are still primarily dominated by $Al_2O_3$ thickness which can be controlled via the oxidation parametrics.

With this background, we can proceed to outline one process path out of several that can be used to form $Al_2O_3$ tunnel barriers. Here the aluminum is thermally oxidized although one could use other techniques such as plasma oxidation or rf sputtering in an oxygen plasma. For the sake of brevity, some details noted above will not be repeated. The formation of the $Al/Al_2O_3/Al$ structures will be seen to be simpler than that described for the Pb/PbO/Pb junctions owing to the much higher melting point of aluminum, relative to lead.

(i) Sputter deposit aluminum on poly-Si at a temperature of 25 to 150 C. Due to thermodynamic forces, the micro-crystallites of the f.c.c. aluminum will have a strong and desirable (111) preferred orientation.

(ii) Oxidize the aluminum in situ in molecular oxygen using temperatures, pressure and time to obtain the desired $Al_2O_3$ thickness. As with PbO, the thickness increases with log (time) and can be controlled via time at a fixed oxygen pressure and temperature to within 0.10 Angstroms, when averaged over a large number of aluminum grains that are present under the counter-electrode. One can readily change the $Al_2O_3$ thickness from ~15 to 35 A by using appropriate oxidation parametrics. The oxide will be amorphous and remain so until temperatures in excess of 400 C are reached. The initiation of recrystallization and grain growth can be suppressed, if desired, via the addition of small amounts of glass forming elements (e.g., Si) without altering the growth kinetics or barrier heights significantly.

(iii) Re-evacuate the system and deposit a second layer of aluminum.

(iv) Deposit the Poly-Si control gate layer using conventional processes.

Example III

Formation of Single- and Multi-Layer Transition Metal Oxide Tunnel Barriers

Single layers of $Ta_2O_5$, $TiO_2$, $ZrO_2$, $Nb_2O_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades. In essence, such metals oxidize via logarithmic kinetics to reach thicknesses of a few to several tens of angstroms in the range of 100 to 300 C. Excellent oxide barriers for Josephson tunnel devices can be formed by rf sputter etching these metals in an oxygen plasma. Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers.

A new approach was described in a patent application by J. M. Eldridge, entitled "Thin Dielectric Films for DRAM Storage Capacitors," patent application Ser. No. 09/651,380 filed Aug. 29, 2000 (now U.S. Pat. No. 6,461,931 and assigned to Micron Technology, Inc.) that utilizes "low temperature oxidation" to form duplex layers of TM oxides. Unlike MOCVD films, the oxides are very pure and stoichiometric as formed. They do require at least a brief high temperature (est. 700 to 800 C but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this earlier disclosure was directed at developing methods and procedures for producing high dielectric constant films for storage cells for DRAMs, the same teachings can be applied to producing thinner metal oxide tunnel films for the flash memory devices described in this disclosure. The dielectric constants of these TM oxides are substantially greater (>25 to 30 or more) than those of PbO and $Al_2O_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by J. M. Eldridge and are well known to practitioners of the art. It is worth mentioning that highly reproducible TM oxide tunnel barriers can be grown by rf sputtering in an oxygen ambient, as referenced above. Control over oxide thickness and other properties in these studies were all the more remarkable in view of the fact that the oxides were typically grown on thick (e.g., 5,000 A) metals such as Nb and Ta. In such metal-oxide systems, a range of layers and sub-oxides can also form, each having their own properties. In the present disclosure, control over the properties of the various TM oxides will be even better since we employ very limited (perhaps 10 to 100 A or so) thicknesses of metal and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Fairly detailed descriptions for producing thicker duplex layers of TM oxides have been given in the copending application by J. M. Eldridge, entitled "Thin Dielectric Films for DRAM Storage Capacitors," patent application Ser. No. 09/651,380 filed Aug. 29, 2000, so there is no need to repeat them here. Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:

(i) Insert certain metals at the TM/poly-Si boundaries that will prevent inter-diffusion of the TM and the poly-Si.

(ii) Completely oxide the TMs. The electrical characteristics of the resulting poly-Si/TM oxide 1/TM oxide 2/poly-Si structure will be different in the absence of having TM at the oxide/metal interfaces.

Example IV

Formation of Alternate Metal Compound Tunnel Barriers

Although no applications may be immediately obvious, it is conceivable that one might want to form a stack of oxide films having quite different properties, for example, a stack comprised of a high dielectric constant (k) oxide/a low k oxide/a high k oxide. "Low temperature oxidation" can be used to form numerous variations of such structures. While most of this disclosure deals with the formation and use of stacks of oxide dielectrics, it is also possible to use "low temperature oxidation" to form other thin film dielectrics such as nitrides, oxynitrides, etc. that could provide additional functions such as being altered by monochromatic light, etc. These will not be discussed further here.

Example V

Formation of Perovskite Oxide Tunnel Barriers

Some results have been obtained which demonstrate that at least a limited range of high temperature, super-conducting oxide films can be made by thermally oxidizing Y—Ba—Cu alloy films. The present inventors have also disclosed how to employ "low temperature oxidation" and short thermal treatments in an inert ambient at 700 C in order to form a range of perovskite oxide films from parent alloy films (see generally, J. M. Eldridge, U.S. Pat. No. 6,730,575, entitled "METHODS OF FORMING PEROVSKITE-TYPE MATERIAL AND CAPACITOR DIELECTRIC HAVING PEROVSKITE-TYPE CRYSTALLINE STRUCTURE"). The dielectric constants of crystallized, perovskite oxides can be very large, with values in the 100 to 1000 or more range. The basic process is more complicated than that needed to oxidize layered films of transition metals. (See Example III.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. or their conductive oxides must be added between the Si and the parent metal film to serve as:

electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

Methods of Operation

Write Operation

Write can be achieved by the normal channel hot electron injection and gate current through the silicon oxide to the floating gate. This is done by selecting a particular column by applying a high control gate voltage and applying relatively large drain voltage as is done with conventional ETOX flash memory devices. However, according to the teachings of the present invention, write can also be accomplished by applying a positive voltage to the substrate or well select line and a large negative voltage to the control gates, electrons will tunnel from the control gate to the floating gate. The low tunnel barrier provided by the intergate insulator will provide an easy write operation and the selection of the substrate or well bias will provide selectivity and address only one device.

Erase Operation

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

Read Operation

Read is accomplished as in conventional SRAM memory devices. A column line is addressed by applying a wordline voltage and sensing the current along the data bit or drain row address line.

System Level

Figure 8:
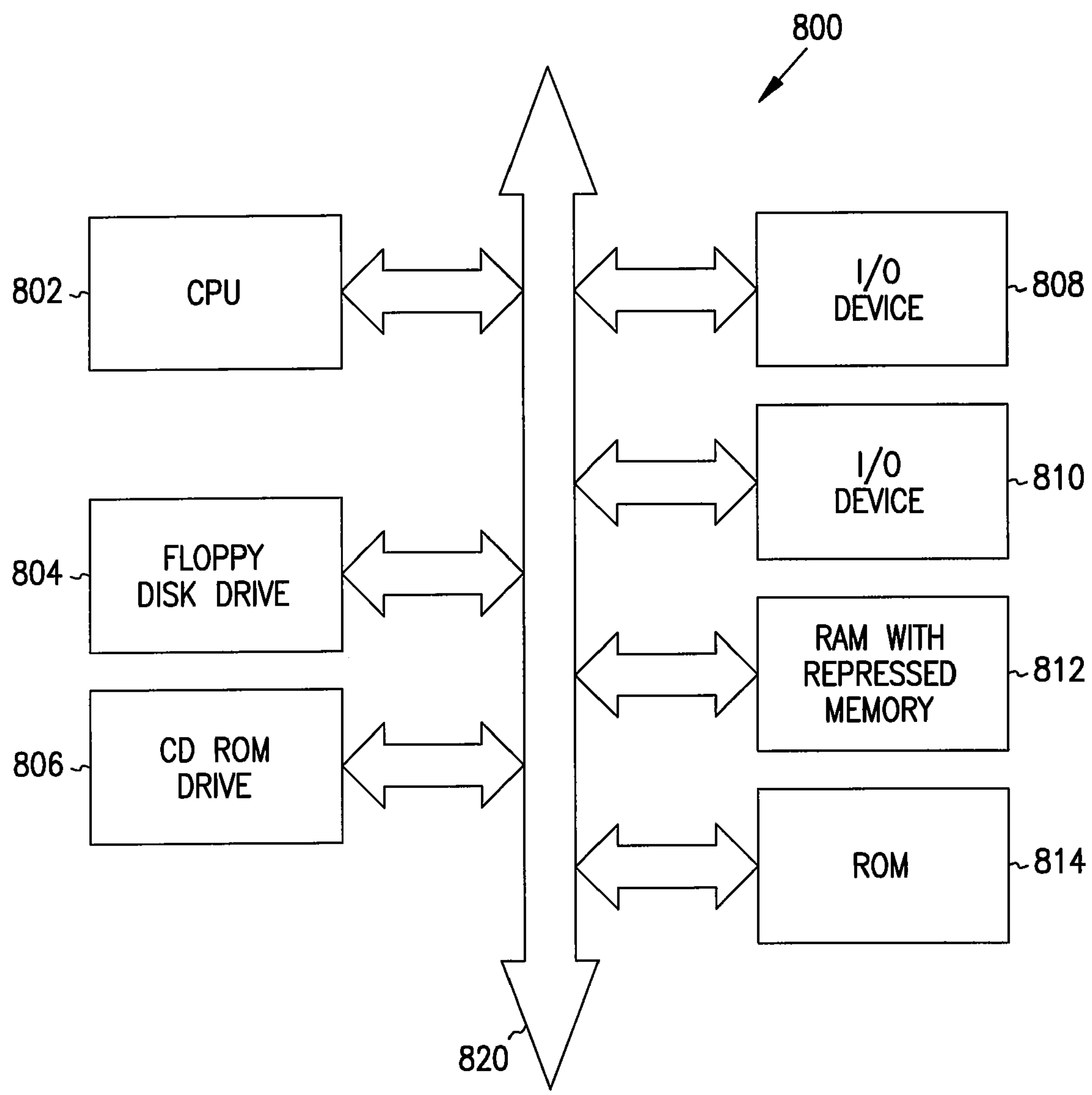
FIG. 8 illustrates a block diagram of a computer system utilizing the SRAM cells illustrated in FIGS. 5A, 5B and 5C.

FIG. 8 is a block diagram of a processor-based system 800 utilizing SRAM with repressed memory 812 constructed in accordance with the present invention. That is, the SRAM 812 utilizes the novel, non-volatile floating gate transistors 400 illustrated in FIG. 4. The processor-based system 800 may be a computer system, a process control system or any other system employing a processor and associated memory. The system 800 includes a central processing unit (CPU) 802, e.g., a microprocessor, that communicates with the SRAM 812 and an I/O device 808 over a bus 820. It must be noted that the bus 820 may be a series of buses and bridges commonly used in a processor-based system, but for convenience purposes only, the bus 820 has been illustrated as a single bus. A second I/O device 810 is illustrated, but is not necessary to practice the invention. The processor-based system 800 also includes read-only memory (ROM) 814 and may include peripheral devices such as a floppy disk drive 804 and a compact disk (CD) ROM drive 806 that also communicates with the CPU 802 over the bus 820 as is well known in the art.

It will be appreciated by those skilled in the art that additional circuitry and control signals can be provided, and that the system 800 has been simplified to help focus on the invention. At least one of the SRAM cells in SRAM 812 has a novel, non-volatile floating gate transistor formed according to the embodiments of the present invention. That is, at least one SRAM cell includes a non-volatile floating gate transistor having a low tunnel barrier interpoly insulator separating the control gate from the floating gate and which is programmable according to the teachings of the present invention.

It will be understood that the embodiment shown in FIG. 8 illustrates an embodiment for electronic system circuitry in which the novel memory cells of the present invention are used. The illustration of system 800, as shown in FIG. 8, is intended to provide a general understanding of one application for the structure and circuitry of the present invention, and is not intended to serve as a complete description of all the elements and features of an electronic system using the novel memory cell structures. Further, the invention is equally applicable to any size and type of SRAM device 812 which has SRAM cells using the novel floating gate transistors of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

The above structures and fabrication methods have been described, by way of example, and not by way of limitation, with respect to SRAM systems and devices having a novel, non-volatile floating gate transistor within the cell. SRAM cells and memory devices are provided where at least one of the transistors in the cross coupled cell includes a novel floating gate transistor, e.g. a non-volatile memory component, which can be programmed to provide the SRAM cell with a definitive asymmetry so that the cell always starts in a particular state. In this manner, the cell can be used both stand alone SRAM and for embedded SRAM in combination with a microcontroller. According to the teachings of the present invention, the non-volatile component includes a floating gate separated from a control gate by a metal oxide and/or low tunnel barrier interpoly insulator. The present invention, describes the use of a cross coupled SRAM cell where at least one of the transistors in the cross coupled cell includes a novel floating gate transistor, e.g. non-volatile memory component as described below, which can be programmed to provide the SRAM cell with a definitive asymmetry so that the cell always starts in a particular state. In this manner, the cell can be used both stand alone SRAM and for embedded SRAM in combination with a microcontroller. The typical application would, in fact, want to be user field or in service programmable with different nonvolatile data patterns stored for each user. One usage for the present invention is to replace a boot ROM, but other applications could be to store data that can be updated or over written later. In other words the cell can be programmed to always start with either a "zero" or "one" stored in the cell and the information used for start-up instructions. This built in asymmetry has no effect upon normal operation of the cell as an SRAM. In these cases large asymmetries are written into the cell by programming it by holding either node voltage, V1, or V2, at ground or a low voltage.

It has been shown that the low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the low tunnel barrier interpoly dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

What is claimed is:

1. A memory cell comprising:

a first inverter; and a second inverter cross coupled to the first inverter, wherein at least one of the first inverter and the second inverter includes at least one transistor comprising:

a source;

a drain;

a channel intermediate the source and the drain;

a control gate;

a floating gate adjacent the channel and the control gate;

at least one barrier including a metal material between the control gate and the floating gate; and an insulator comprising a metal oxide separating the floating gate from the control gate.

2. The memory cell of claim 1, wherein the insulator includes lead.

3. The memory cell of claim 1, wherein the insulator includes lead oxide.

4. The memory cell of claim 1, wherein the insulator includes aluminum oxide.

5. The memory cell of claim 1, wherein the insulator includes $Ta_2O_5$.

6. The memory cell of claim 1, wherein the insulator includes $TiO_2$.

7. The memory cell of claim 1, wherein the insulator includes $ZrO_2$.

8. The memory cell of claim 1, wherein the insulator includes $Nb_2O_5$.

9. The memory cell of claim 1, wherein the at least one transistor is configured such that the floating gate can be written to by tunneling electrons from the control gate to the floating gate.

10. The memory cell of claim 1, wherein the at least one transistor is configured such that the floating gate can be erased to by tunneling electrons from the floating gate to the control gate.

11. A memory cell comprising:

a first inverter; and a second inverter cross coupled to the first inverter, wherein at least one of the first inverter and the second inverter includes at least one transistor comprising:

a source;

a drain;

a channel intermediate the source and the drain;

a control gate;

a floating gate adjacent the channel and the control gate;

at least one barrier including a metal material between the control gate and the floating gate; and an insulator comprising a Perovskite oxide separating the floating gate from the control gate.

12. The memory cell of claim 11, wherein the at least one transistor is configured such that the floating gate can be written to by tunneling electrons from the control gate to the floating gate.

13. The memory cell of claim 11, wherein the at least one transistor is configured such that the floating gate can be erased to by tunneling electrons from the floating gate to the control gate.

* * * * *